(12) United States Patent
Chen et al.

(10) Patent No.: US 11,665,931 B2
(45) Date of Patent: May 30, 2023

(54) DESCENDING ETCHING RESISTANCE IN ADVANCED SUBSTRATE PATTERNING

(71) Applicant: Applied Materials, Inc., Santa Clara, CA (US)

(72) Inventors: Chung-Chia Chen, Hsinchu (TW); Ji Young Choung, Hwaseong-si (KR); Dieter Haas, San Jose, CA (US); Yu-Hsin Lin, Hsinchu (TW); Jungmin Lee, Santa Clara, CA (US); Wen-Hao Wu, San Jose, CA (US); Si Kyoung Kim, Gwangju-si (KR)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/881,358

(22) Filed: Aug. 4, 2022

(65) Prior Publication Data

US 2023/0041252 A1 Feb. 9, 2023

Related U.S. Application Data

(60) Provisional application No. 63/229,266, filed on Aug. 4, 2021.

(51) Int. Cl.
*H01L 27/32* (2006.01)
*H01L 51/56* (2006.01)
(Continued)

(52) U.S. Cl.
CPC ......... *H10K 59/122* (2023.02); *H10K 50/844* (2023.02); *H10K 71/00* (2023.02); *H10K 2102/00* (2023.02)

(58) Field of Classification Search
CPC ............. H01L 27/3246; H01L 27/3283; H01L 27/3295; H01L 27/3258; H01L 2251/301; H01L 51/5253–5256; H01L 51/56
See application file for complete search history.

(56) References Cited

U.S. PATENT DOCUMENTS 6,060,728 A 5/2000 Ghosh et al.
6,137,220 A * 10/2000 Nagayama .......... H01L 51/5253
                                                              313/506
(Continued)

FOREIGN PATENT DOCUMENTS

CN         105742311 B      11/2018
JP         H09330792 A      12/1997
(Continued)

OTHER PUBLICATIONS

PCT/US2022/039443, International Search Report and Written Opinion dated Nov. 23, 2022, 9 pages.
(Continued)

*Primary Examiner* — Shaun M Campbell
(74) *Attorney, Agent, or Firm* — Patterson + Sheridan, LLP

(57) ABSTRACT

Embodiments described herein relate to a device comprising a substrate, a pixel-defining layer (PDL) structures disposed over the substrate and defining sub-pixels of the device, and a plurality overhang structures. Each overhang structure is defined by a top structure extending laterally past a body structure. Each body structure is disposed over an upper surface of each PDL structure. Overhang structures define a plurality of sub-pixels including a first sub-pixel and a second sub-pixel. Each sub-pixel includes an anode, an organic light-emitting diode (OLED) material, a cathode, and an encapsulation layer. The OLED materials are disposed over the first anode and extends under the overhang structures. The cathodes are disposed over the OLED materials and under the overhang structures. The encapsulation layers are disposed over the first cathode. The first encapsulation layer has a first thickness and the second encapsulation layer has a second thickness different from the first thickness.

30 Claims, 15 Drawing Sheets

(51) Int. Cl.
  *H01L 51/52* (2006.01)
  *H10K 59/122* (2023.01)
  *H10K 50/844* (2023.01)
  *H10K 71/00* (2023.01)
  *H10K 102/00* (2023.01)

(56) References Cited

U.S. PATENT DOCUMENTS

| | | | |
|---|---|---|---|
| 6,476,988 B1 | 11/2002 | Yudasaka | |
| 8,686,629 B2 | 4/2014 | Oh et al. | |
| 8,987,717 B2 | 3/2015 | Kang | |
| 9,324,962 B2 | 4/2016 | Kim | |
| 9,337,244 B2 | 5/2016 | Hatano et al. | |
| 10,170,526 B1 | 1/2019 | Yang | |
| 10,325,970 B2 | 6/2019 | Bang et al. | |
| 10,580,843 B2 | 3/2020 | Zhao et al. | |
| 10,615,231 B2 | 4/2020 | Wu et al. | |
| 11,532,680 B2* | 12/2022 | Takagi | H01L 51/5253 |
| 2002/0014836 A1 | 2/2002 | Codama et al. | |
| 2003/0006697 A1 | 1/2003 | Weaver | |
| 2004/0169468 A1 | 9/2004 | Peng | |
| 2004/0180457 A1 | 9/2004 | Birnstosk et al. | |
| 2005/0099114 A1* | 5/2005 | Wu | H01L 27/3283 313/506 |
| 2006/0170340 A1 | 8/2006 | Tzen et al. | |
| 2009/0009069 A1 | 1/2009 | Takata | |
| 2012/0007057 A1* | 1/2012 | Choi | H01L 51/56 257/E51.019 |
| 2012/0217516 A1* | 8/2012 | Hatano | H01L 51/525 257/E33.062 |
| 2012/0228603 A1 | 9/2012 | Nakamura | |
| 2013/0001620 A1* | 1/2013 | Sugisawa | H01L 27/3246 257/E33.062 |
| 2014/0131743 A1 | 5/2014 | Jiang et al. | |
| 2017/0069695 A1 | 3/2017 | Choung et al. | |
| 2018/0190737 A1* | 7/2018 | Yang | H01L 27/3258 |
| 2018/0358584 A1 | 12/2018 | Jeong et al. | |
| 2019/0058020 A1 | 2/2019 | Tsai et al. | |
| 2019/0088730 A1 | 3/2019 | Lee et al. | |
| 2019/0334112 A1 | 10/2019 | Lee et al. | |
| 2019/0348482 A1 | 11/2019 | Bae et al. | |
| 2020/0119114 A1 | 4/2020 | Kim et al. | |
| 2020/0168670 A1* | 5/2020 | Kim | H01L 27/3246 |
| 2020/0312930 A1 | 10/2020 | Choi et al. | |
| 2021/0119183 A1* | 4/2021 | Lee | H01L 51/5271 |
| 2021/0135150 A1* | 5/2021 | Wang | H01L 25/167 |

FOREIGN PATENT DOCUMENTS

| | | |
|---|---|---|
| JP | 2002-056986 A | 2/2002 |
| JP | 2016225319 A | 12/2016 |
| KR | 102207605 B1 | 1/2021 |

OTHER PUBLICATIONS

International Search Report/Written Opinion issued to PCT/US2021/021097 dated Jul. 1, 2021.

International Search Report/Written Opinion issued to PCT/US2021/021077 dated Jun. 23, 2021.

* cited by examiner

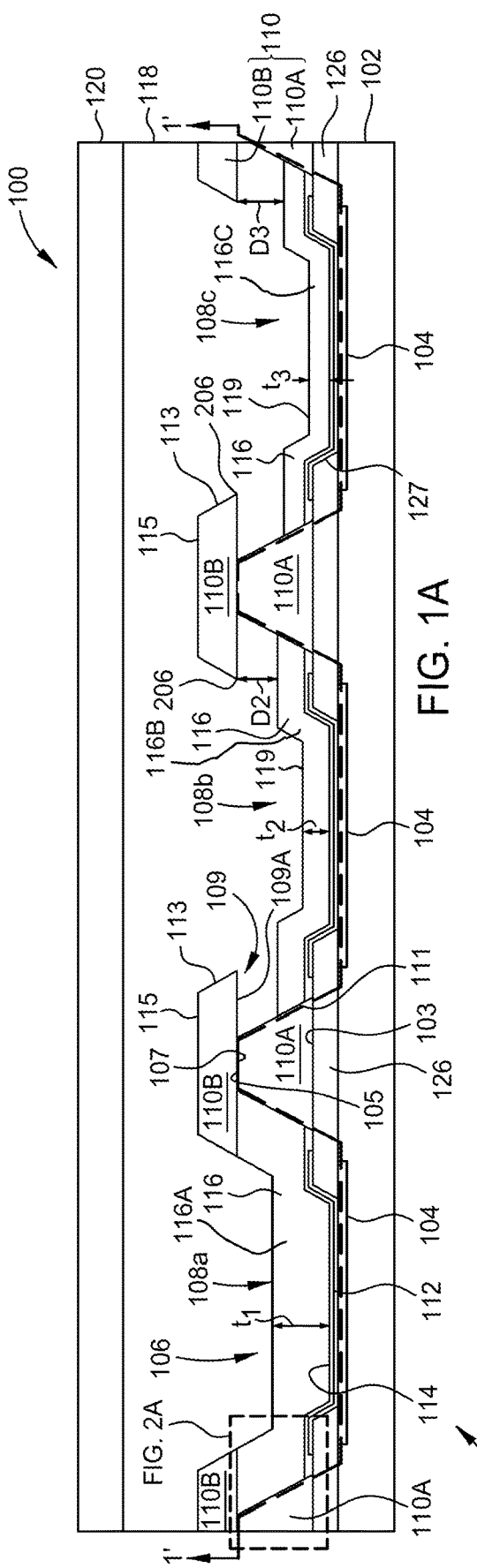
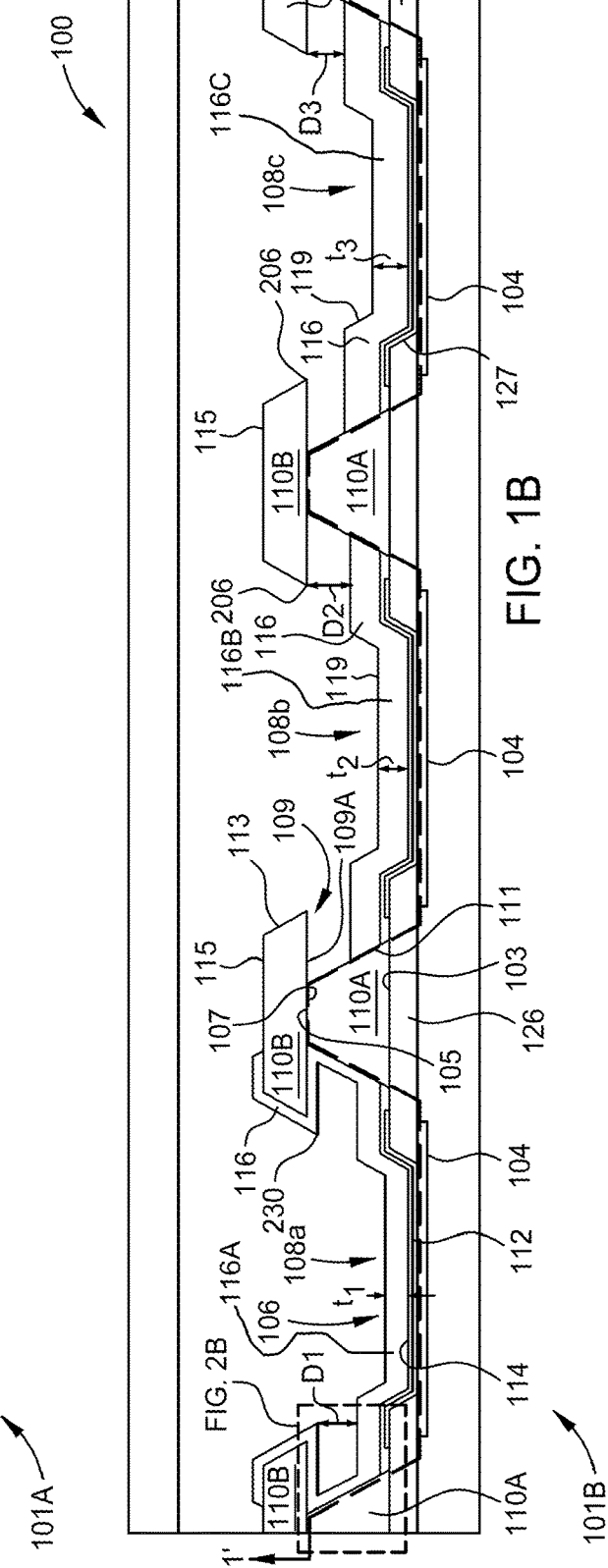

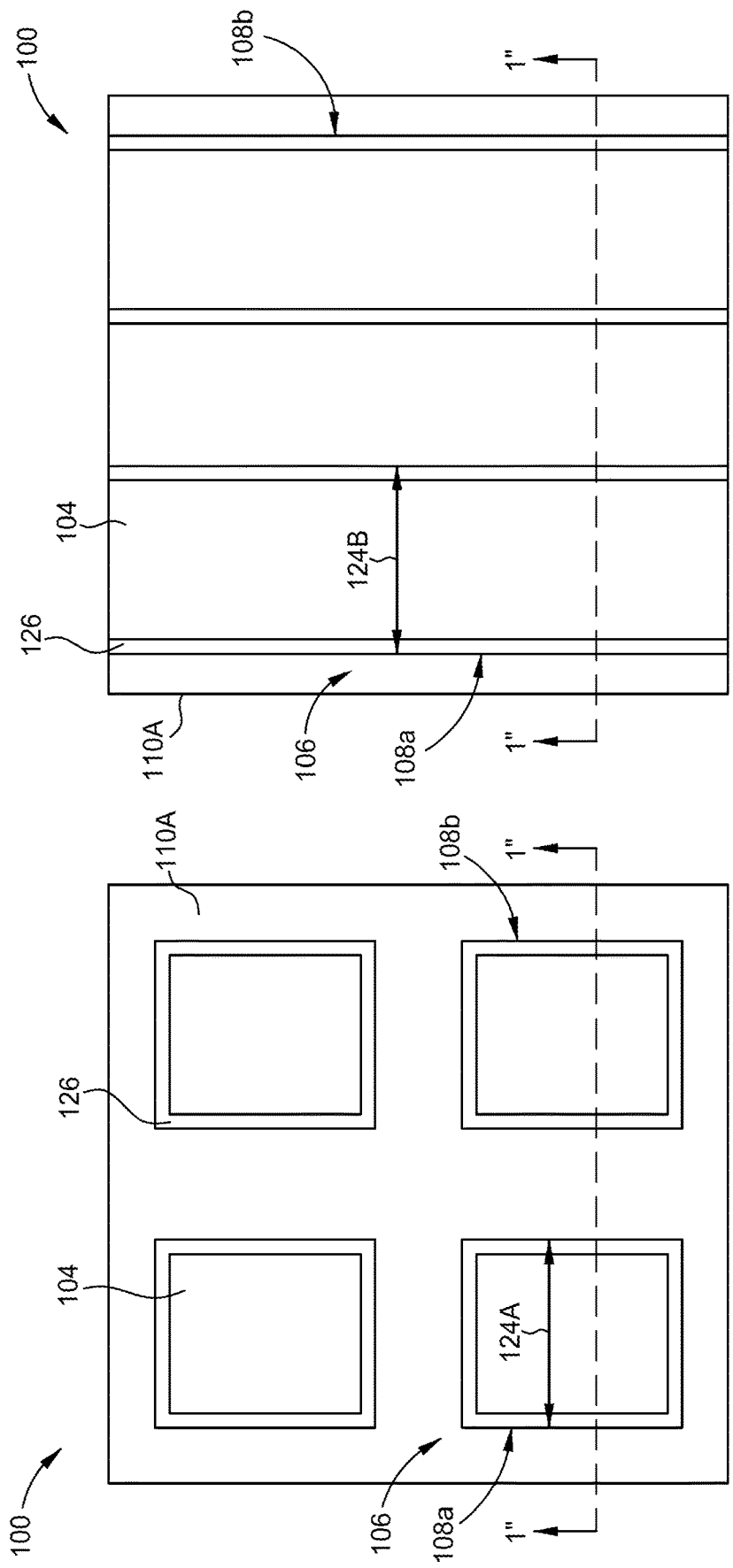

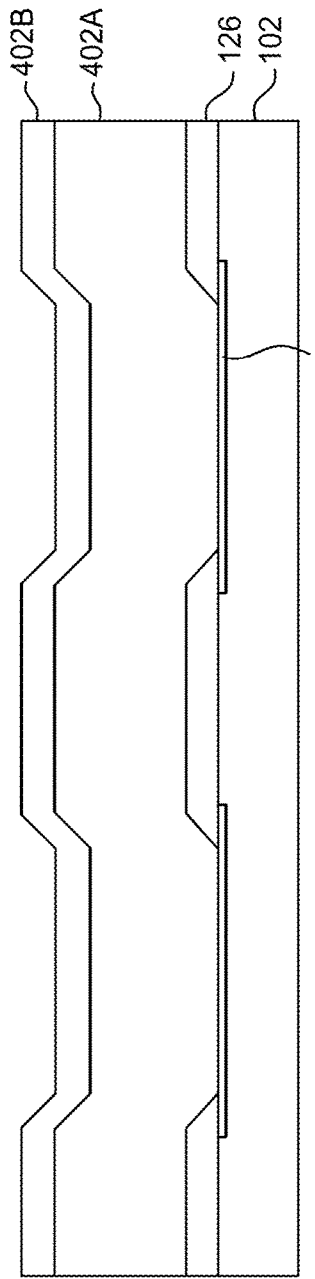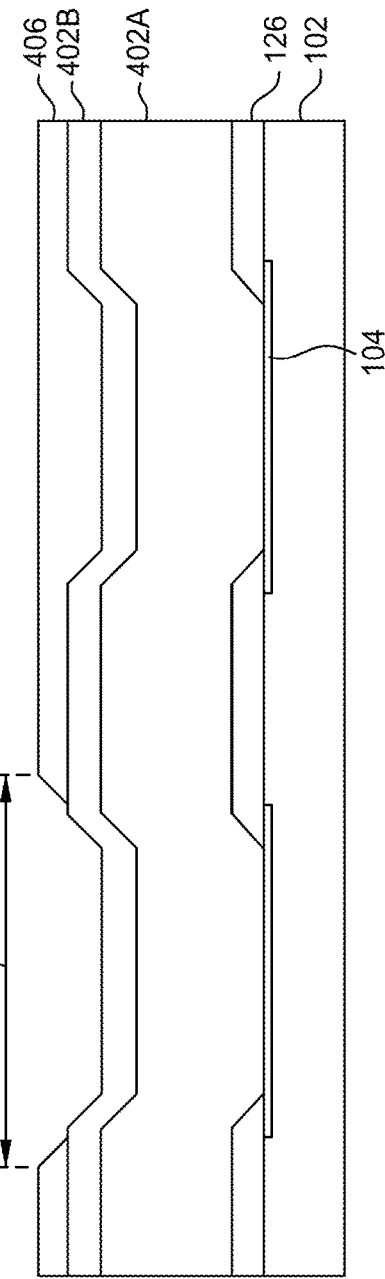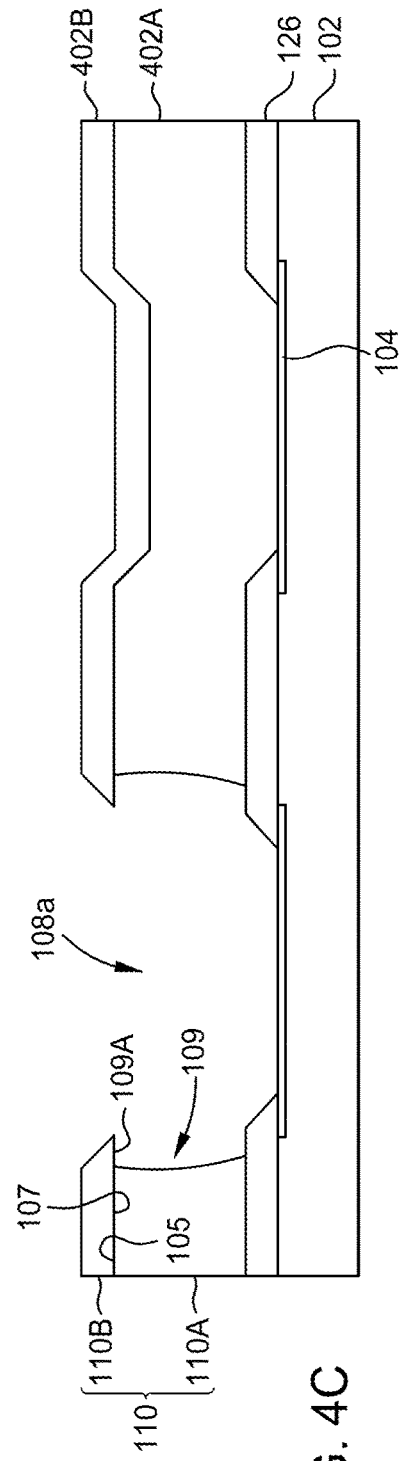

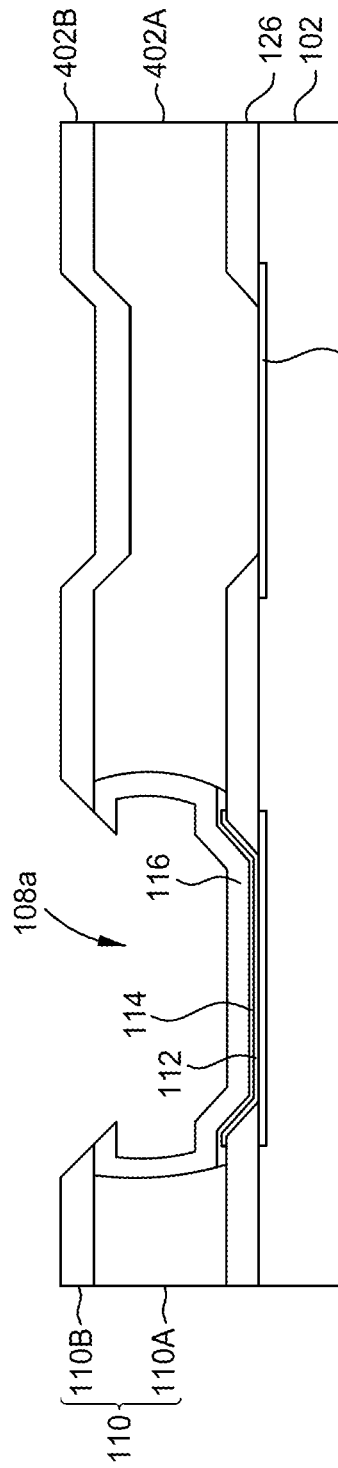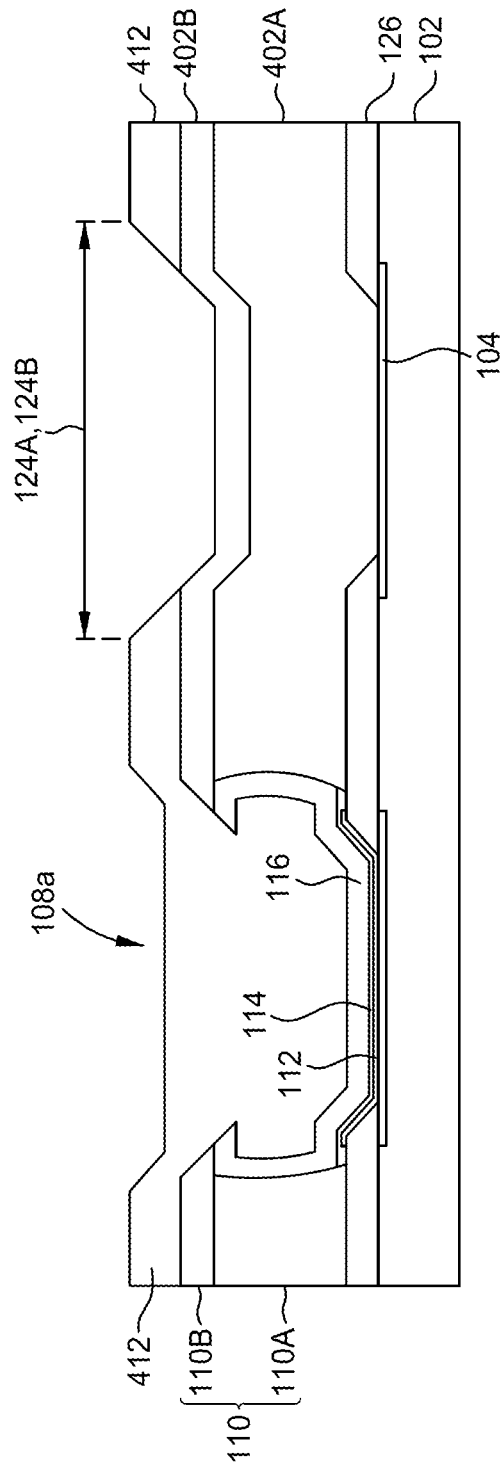
FIG. 4F
FIG. 4G

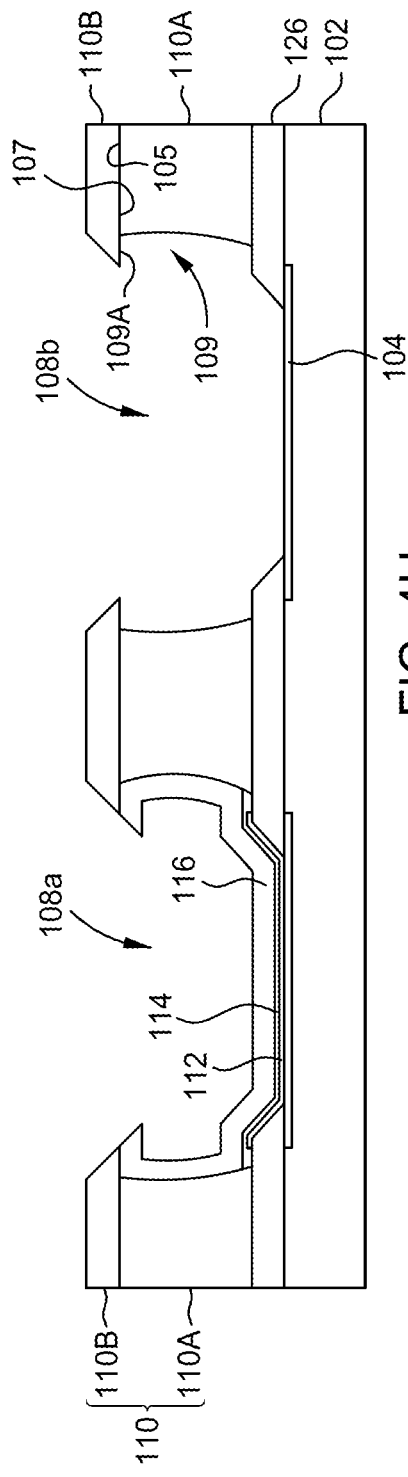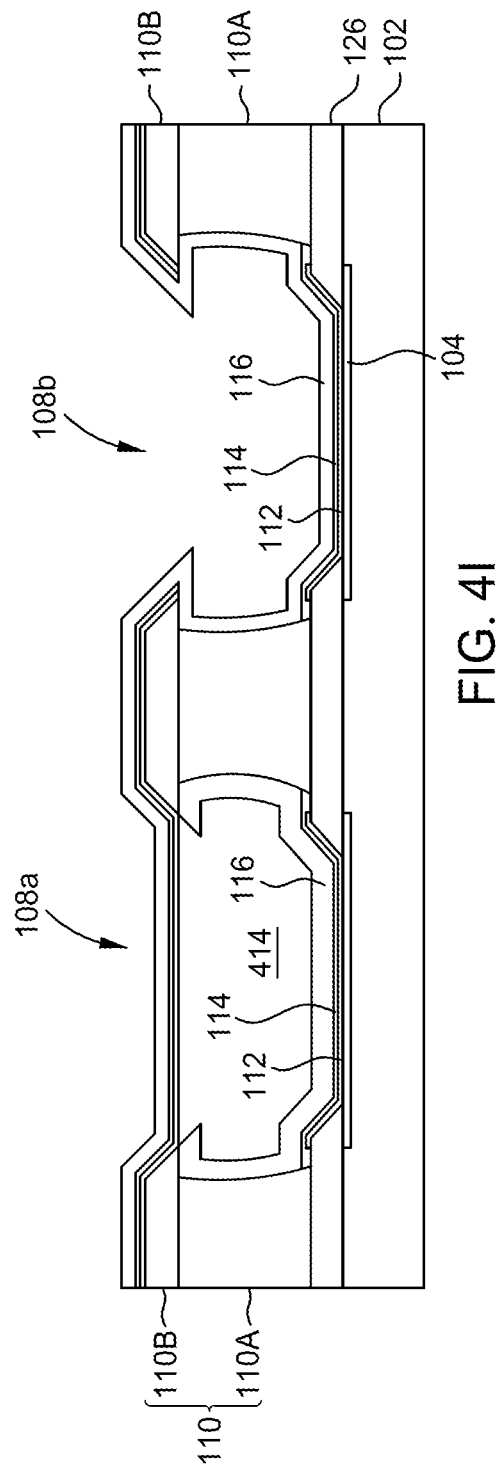

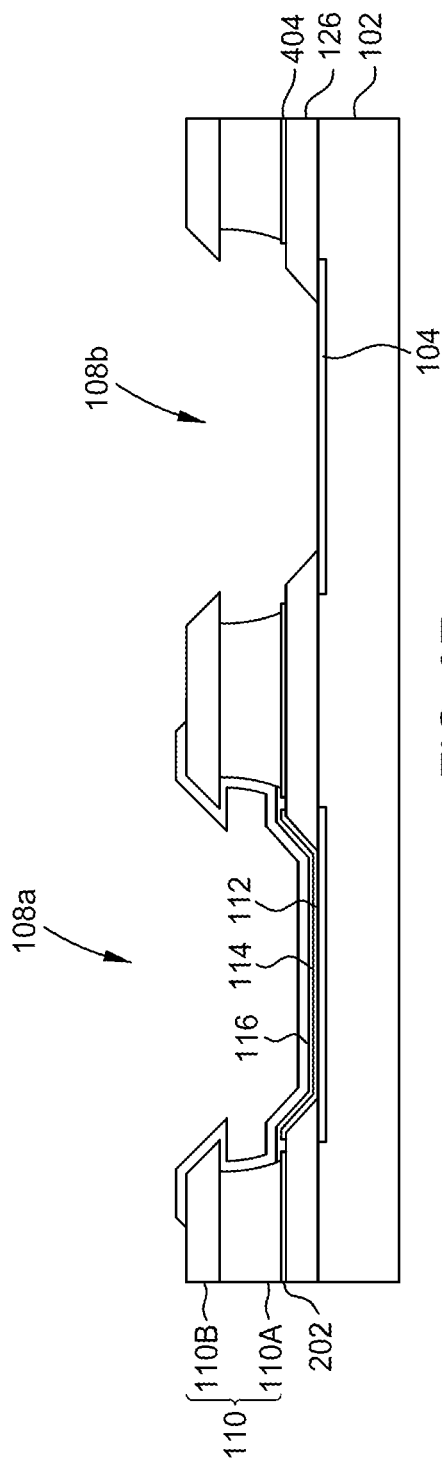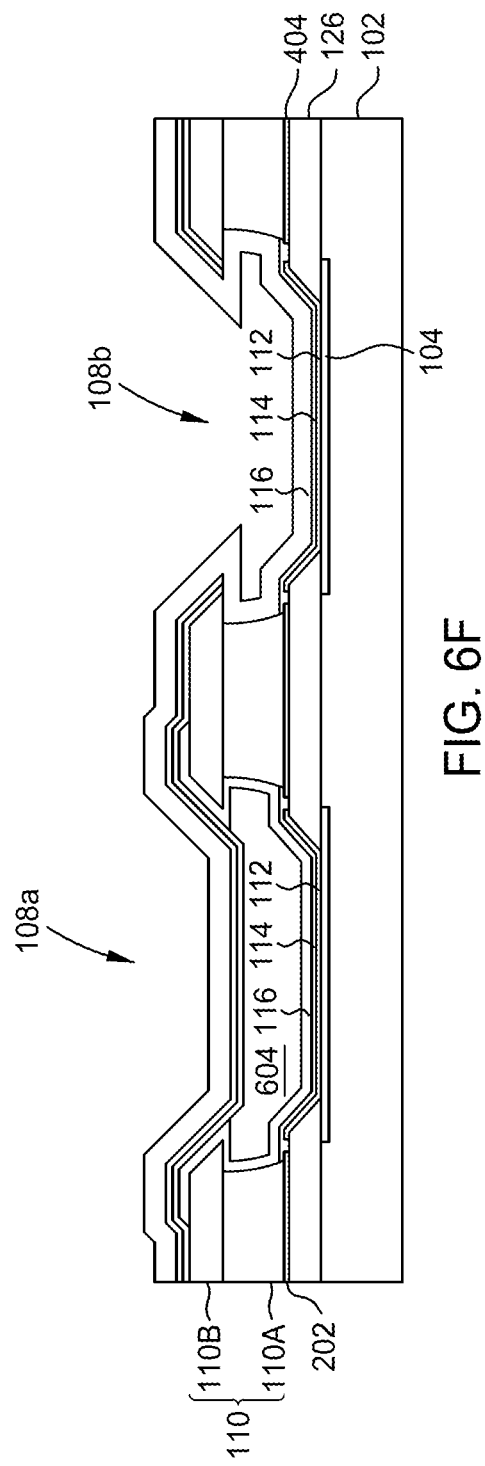

DESCENDING ETCHING RESISTANCE IN ADVANCED SUBSTRATE PATTERNING

CROSS-REFERENCE TO RELATED APPLICATIONS

This application claims priority to U.S. Provisional Patent Application Ser. No. 63/229,266, filed on Aug. 4, 2021, which is herein incorporated by reference.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photolithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits that may be utilized in a display such as an organic OLED display.

SUMMARY

In one embodiment, a device is provided. The device includes a substrate, a pixel-defining layer (PDL) structures disposed over the substrate and defining sub-pixels of the device, and a plurality overhang structures. Each overhang structure is defined by a top extension of a top structure extending laterally past a body structure. Each body structure is disposed over an upper surface of each PDL structure. The overhang structures define a plurality of sub-pixels including a first sub-pixel and a second sub-pixel. The first sub-pixel includes a first anode, a first organic light-emitting diode (OLED) material, a first cathode, and a first encapsulation layer. The first OLED material is disposed over and in contact with the first anode and under the adjacent overhang structures. The first cathode is disposed over the first OLED material and under the adjacent overhang structures. The first encapsulation layer disposed over the first cathode, extending under the adjacent overhang structures and contacting a portion of a sidewall of the adjacent overhang structures. The first encapsulation layer has a first thickness. The second sub-pixel includes a second anode, a second OLED material, a second cathode, and a second encapsulation layer. The second organic light-emitting diode (OLED) material is disposed over and in contact with the second anode and under the overhang structures. The second cathode is disposed over the second OLED material and under the adjacent overhang structures. The second encapsulation layer is disposed over the second cathode, extending under the adjacent overhang structures and contacting a portion of a sidewall of the adjacent overhang structures. The second encapsulation layer having a second thickness different than the first thickness.

In another embodiment, a device is provided. The device includes a substrate, a pixel-defining layer (PDL) structures disposed over the substrate and defining sub-pixels of the device, and a plurality overhang structures. Each overhang structure is defined by a top extension of a top structure extending laterally past a body structure to form an overhang. Each body structure is disposed over an upper surface of each PDL structure. The adjacent overhang structures of the plurality overhang structures define a plurality of sub-pixels including a first sub-pixel and a second sub-pixel. The first sub-pixel includes a first anode, a first organic light-emitting diode (OLED) material, a first cathode and a first encapsulation layer. The first OLED material is disposed over and in contact with the first anode and under the adjacent overhang structures. The first cathode is disposed over the first OLED material and under the adjacent overhang structures. The first encapsulation layer disposed over the first cathode, extending under the adjacent overhang structures and contacting a portion of a sidewall of the overhang structures. The first encapsulation layer is in an entire area of the overhang and has a first thickness. The second sub-pixel includes a second anode, a second OLED material, a second cathode, and a second encapsulation layer. The second OLED material is disposed over and in contact with the second anode and under the adjacent overhang structures. The second cathode disposed over the second OLED material and under the adjacent overhang structures. The second encapsulation layer is disposed over the second cathode, extending under the adjacent overhang structures and contacting a portion of a sidewall of the adjacent overhang structures. The second encapsulation layer has a second thickness that is different from the first thickness.

In yet another embodiment, a device is provided. The device includes a substrate, a pixel-defining layer (PDL) structures disposed over the substrate and defining sub-pixels of the device, and a plurality overhang structures. Each overhang structure is defined by a top extension of a top structure extending laterally past a body structure to form an overhang. Each body structure disposed over an upper surface of each PDL structure. The adjacent overhang structures of the plurality overhang structures define a plurality of sub-pixels including a first sub-pixel, a second sub-pixel, and a third sub-pixel. The first sub-pixel includes a first anode, a first organic light emitting diode (OLED), a first cathode, and a first encapsulation layer. The first OLED material is disposed over and in contact with the first anode and under the adjacent overhang structures. The first cathode is disposed over the first OLED material, the first cathode extends under the adjacent overhang structures and contacting a portion of the overhang structures. The first encapsulation layer is disposed over the first cathode, extending under the adjacent overhang structures and contacting a portion of a sidewall of the overhang structures. The encapsulation layer has a first thickness. The second sub-pixel a second anode, a second OLED material, a second cathode, and a second encapsulation layer. The second OLED material is disposed over and in contact with the second anode and under the adjacent overhang structures. The second cathode is disposed over the second OLED material, the second cathode extending under the adjacent overhang structures and contacting a portion of the overhang structures. The second encapsulation layer is disposed over the second cathode, extending under the adjacent overhang structures and contacting a portion of a sidewall of the overhang structures. The second encapsulation layer has a second thickness that is different than the first thickness. The third sub-pixel includes a third anode, a third OLED material, a third cathode, and a third encapsulation layer. The third OLED material is disposed over and in contact with the third anode and under the adjacent overhang structures. The third cathode is disposed over the third OLED material extending under the adjacent overhang structures and contacting a portion of a body structure. The third encapsulation layer is disposed over the third cathode, extending under the adjacent overhang structures and contacting a portion of the sidewall of the overhang structures. The encapsulation layer has a third thickness that is different from the first thickness and the second thickness.

In yet another embodiment, a device is provided. The device includes a substrate, a pixel-defining layer (PDL) structures disposed over the substrate and defining sub-pixels of the device, and a plurality overhang structures. Each overhang structure is defined by a top extension of a top structure extending laterally past a body structure. Each body structure is disposed over an upper surface of each PDL structure. The adjacent overhang structures of the plurality overhang structures are define a plurality of sub-pixels including a first sub-pixel and a second sub-pixel. The first sub-pixel includes a first anode, a first organic light-emitting diode (OLED) material, a first cathode, and a first encapsulation layer. The first OLED material is disposed over and in contact with the first anode and under the adjacent overhang structures. The first cathode is disposed over the first OLED material and under the adjacent overhang structures. The first encapsulation layer is disposed over the first cathode, extending under the adjacent overhang structures and contacting a portion of a sidewall of the adjacent overhang structures. The first encapsulation layer comprises at least two layers of a silicon-containing material. The second sub-pixel includes a second anode, a second OLED, a second cathode, and a second encapsulation layer. The second OLED material is disposed over and in contact with the second anode and under the adjacent overhang structures. The second cathode is disposed over the second OLED material and under the adjacent overhang structures. The second encapsulation layer is disposed over the second cathode, extending under the adjacent overhang structures and contacting a portion of a sidewall of the adjacent overhang structures. The second encapsulation layer comprises the silicon-containing material with a different composition than the first encapsulation layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1A is a schematic, cross-sectional view of a sub-pixel circuit, according to embodiments.

FIG. 1B is a schematic, cross-sectional view of a sub-pixel circuit, according to embodiments.

FIG. 1C is a schematic, top sectional view of a sub-pixel circuit having a dot-type architecture, according to embodiments.

FIG. 1D is a schematic, cross-sectional view of a sub-pixel circuit having a line-type architecture, according to embodiments.

FIGS. 4A-4K are schematic, cross-sectional views of a substrate during a method for forming a sub-pixel circuit according embodiments.

FIGS. 6A-6H are schematic, cross-sectional views of a substrate during a method for forming a sub-pixel circuit according embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2A:
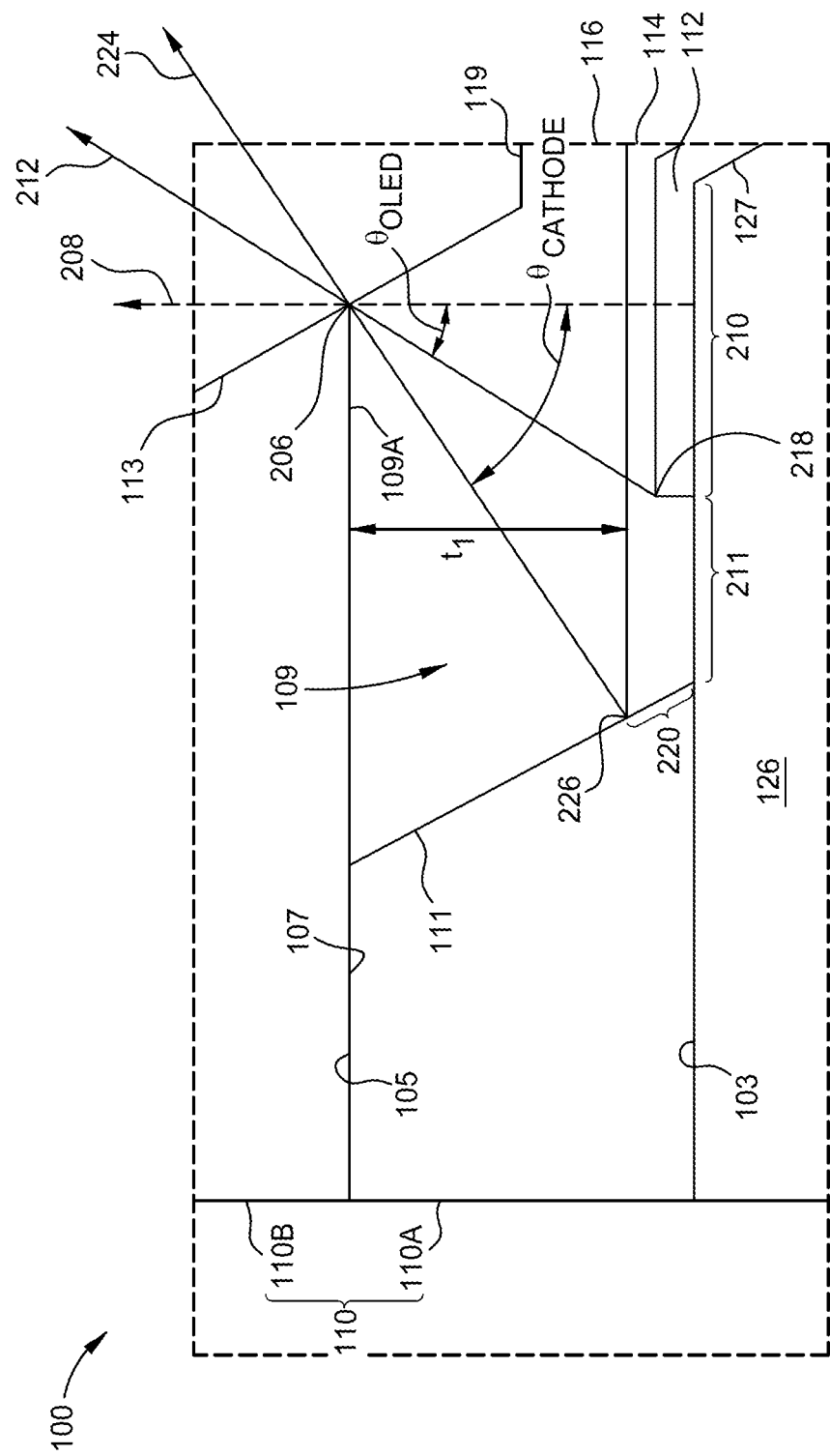
FIG. 2A is a schematic, cross-sectional view of an overhang structure of a sub-pixel circuit, according to embodiments.

Embodiments described herein generally relate to a display. More specifically, embodiments described herein relate to sub-pixel circuits and methods of forming sub-pixel circuits that may be utilized in a display such as an organic light-emitting diode (OLED) display.

Each of the embodiments described herein of the sub-pixel circuit include a plurality of sub-pixels with each of the sub-pixels defined by adjacent overhang structures that are permanent to the sub-pixel circuit. While the Figures depict three sub-pixels with each sub-pixel defined by adjacent overhang structures, the sub-pixel circuit of the embodiments described herein include a plurality of sub-pixels, such as three or more sub-pixels. Each sub-pixel has the OLED material configured to emit a white, red, green, blue or other color light when energized. E.g., the OLED material of a first sub-pixel emits a red light when energized, the OLED material of a second sub-pixel emits a green light when energized, and the OLED material of a third sub-pixel emits a blue light when energized.

The overhang structures are permanent to the sub-pixel circuit and include at least a top structure disposed over a body structure. The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition is utilized for deposition of OLED materials (including a hole injection layer (HIL), a hole transport layer (HTL), an emissive layer (EML), and an electron transport layer (ETL)) and cathode. In one embodiment, the HIL layer has a greater conductivity than the HTL layer. In another embodiment, the HIL layer has a greater energy level than the HTL layer. In some instances, an encapsulation layer may be disposed via evaporation deposition. In embodiments including one or more capping layers, the capping layers are disposed between the cathode and the encapsulation layer. The overhang structures and the evaporation angle set by the evaporation source define the deposition angles, i.e., the overhang structures provide for a shadowing effect during evaporation deposition with the evaporation angle set by the evaporation source. In order to deposit at a particular angle, the evaporation source is configured to emit the deposition material at a particular angle with regard to the overhang structure. The encapsulation layer of a respective sub-pixel is disposed over the cathode with the encapsulation layer extending under at least a portion of each of the adjacent overhang structures. The encapsulation layer of each sub-pixel contacts at least a portion of a sidewall of each of the adjacent overhang structures. The encapsulation layer can be varied by thickness, composition, and deposition method depending on the OLED materials deposited on the sub-pixels.

FIG. 1A is a schematic, cross-sectional view of a sub-pixel circuit 100 having an arrangement 101A. The cross-sectional view of FIG. 1A is taken along section line 1"-1" of FIGS. 1C and 1D. FIG. 1B is a schematic, cross-sectional view of a sub-pixel circuit 100 having arrangement 101B. The cross-sectional view of FIG. 1B is taken along section line 1"-1" of FIGS. 1C and 1D.

The sub-pixel circuit 100 includes a substrate 102. Metal-containing layers 104 may be patterned on the substrate 102 and are defined by adjacent pixel-defining layer (PDL) structures 126 disposed on the substrate 102. In one embodiment, the metal-containing layers 104 are pre-patterned on the substrate 102. E.g., the substrate 102 is a pre-patterned indium tin oxide (ITO) glass substrate. The metal-containing layers 104 are configured to operate anodes of respective sub-pixels. The metal-containing layers 104 include, but are not limited to, chromium, titanium, gold, silver, copper, aluminum, ITO, a combination thereof, or other suitably conductive materials.

The PDL structures 126 are disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 126 define a respective sub-pixel and expose the anode (i.e., metal-containing layer 104) of the respective sub-pixel of the sub-pixel circuit 100.

The sub-pixel circuit 100 has a plurality of sub-pixels 106 including at least a first sub-pixel 108a, a second sub-pixel 108b, and a third sub-pixel 108c. While the Figures depict the first sub-pixel 108a, the second sub-pixel 108b, and the third sub-pixel 108c, the sub-pixel circuit 100 of the embodiments described herein may include three or more sub-pixels 106, such as a fourth and a fifth sub-pixel. Each sub-pixel 106 has an organic light-emitting diode (OLED) material 112 configured to emit a white, red, green, blue or other color light when energized. E.g., the OLED material 112 of the first sub-pixel 108a emits a red light when energized, the OLED material of the second sub-pixel 108b emits a green light when energized, the OLED material of a third sub-pixel 108c emits a blue light when energized, and the OLED material of a fourth sub-pixel and a fifth sub-pixel emits another color light when energized.

Overhang structures 110 are disposed on an upper surface 103 of each of the PDL structures 126. The overhang structures 110 are permanent to the sub-pixel circuit. The overhang structures 110 further define each sub-pixel 106 of the sub-pixel circuit 100. The overhang structures 110 include at least a top structure 110b disposed over a body structure 110A. In one embodiment, the top structure 110b is disposed on the body structure 110A. The body structure 110A is disposed over the upper surface 103 of the PDL structure 126. In one embodiment, the body structure 110A is disposed on the upper surface 103 of the PDL structure 126. Each overhang structure 110 includes adjacent overhangs 109. The adjacent overhangs 109 are defined by a top extension 109A of the top structure 110B extending laterally past a sidewall 111 of the body structure 110A.

The top structure 110B includes one of a non-conductive material, inorganic material, or metal-containing material. The body structure 110A includes an inorganic material or metal-containing material. The non-conductive material includes, but it not limited to, an inorganic silicon-containing material. E.g., the silicon-containing material includes oxides or nitrides of silicon, or combinations thereof. The metal-containing materials include at least one of a metal or metal alloy such as titanium (Ti), aluminum (Al), aluminum neodymium (AlNd), molybdenum (Mo), molybdenum tungsten (MoW), copper (Cu), or combinations thereof. The inorganic materials of the body structure 110A and the top structure 110B include titanium (Ti), silicon nitride ($Si_3N_4$), silicon oxide ($SiO_2$), silicon oxynitride ($Si_2N_2O$), or combinations thereof. The overhang structures 110 are able to remain in place, i.e., are permanent. Thus, organic material from lifted off overhang structures that disrupt OLED performance would not be left behind. Eliminating the need for a lift-off procedure also increases throughput.

Figure 2B:
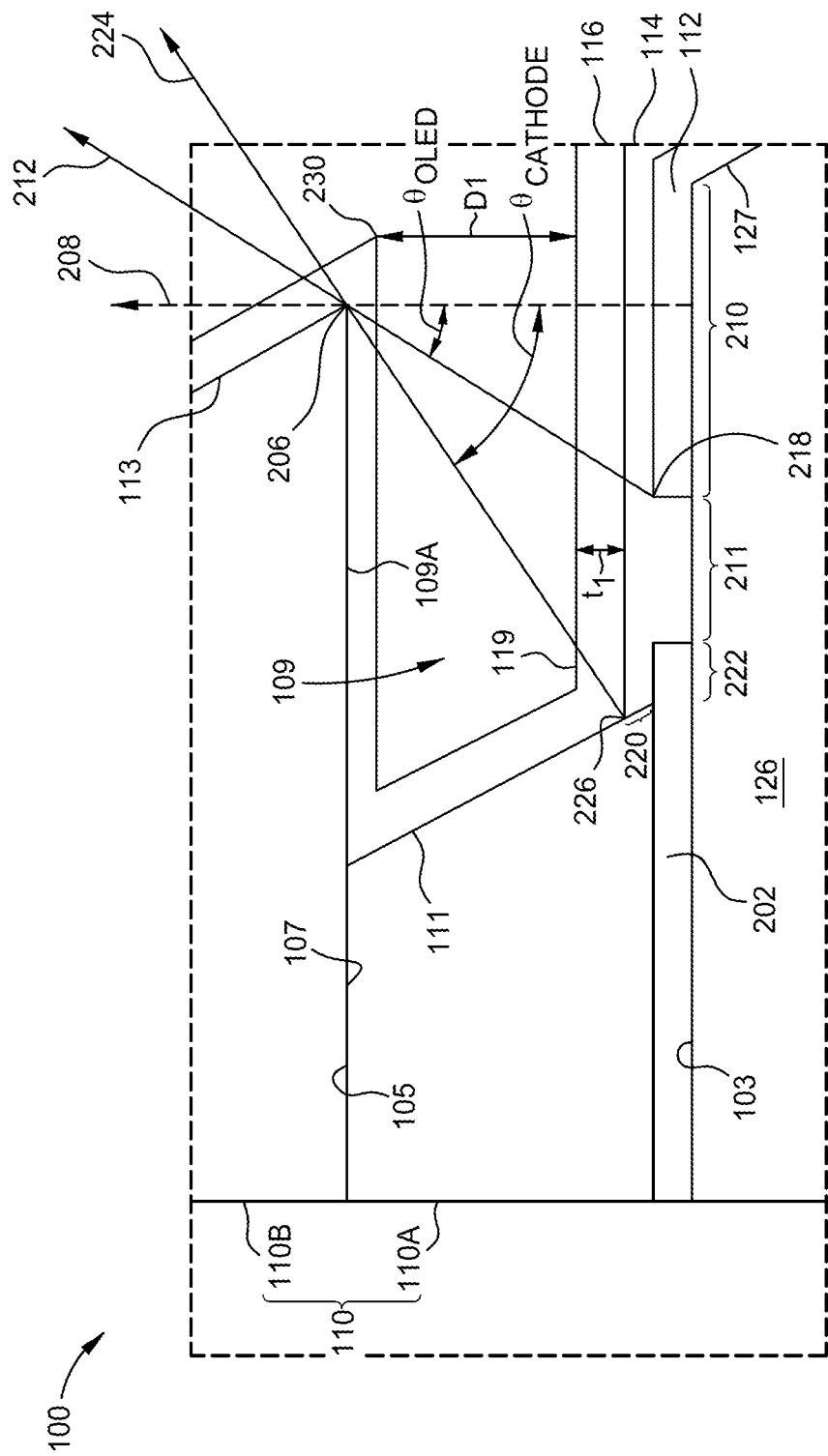
FIG. 2B is a schematic, cross-sectional view of an overhang structure of a sub-pixel circuit, according to embodiments.

In one example, the top structure 110B includes a non-conductive inorganic material and the body structure 110A includes a conductive inorganic material or a metal-containing material. In another example, the top structure 110B includes a conductive inorganic material or metal-containing material and the body structure 110A includes a conductive inorganic material or metal-containing material. An assistant cathode 202 (shown in FIG. 2B) may be disposed under the body structure 110A Adjacent overhangs 109 are defined by the top extension 109A of the top structure 110B. At least a bottom surface 107 of the top structure 110B is wider than a top surface 105 of the body structure 110A to form the top extension 109A (as shown in FIG. 1B) of the overhang 109. The top structure 110B is disposed over a top surface 105 of the body structure 110A. The top extension 109A of the top structure 110B forms the overhang 109 and allows for the top structure 110B to shadow the body structure 110A. The shadowing of the overhang 109 provides for evaporation deposition of each of the OLED material 112 and a cathode 114. The OLED material 112 is disposed under the overhang 109. The cathode 114 is disposed over the OLED material 112 and extends under the overhang 109. In one embodiment, as shown in FIGS. 2A and 2B, the cathode 114 contacts a first portion 220 of the sidewall 111 of the body structure 110A.

The overhang structures 110 and an evaporation angle set by an evaporation source define deposition angles, i.e., the overhang structures 110 provide for a shadowing effect during evaporation deposition with the evaporation angle set by the evaporation source. The overhang 109 and the evaporation source define an OLED angle $\theta_{OLED}$ of the OLED material 112 and a cathode angle $\theta_{cathode}$ of the cathode 114 (shown in FIGS. 2A and 2B). The OLED angle $\theta_{OLED}$ of the OLED material 112 and the cathode angle $\theta_{cathode}$ of the cathode 114 result from the overhang structures 110 and the evaporation angle set by the evaporation source, i.e., the overhang structures 110 provide for a shadowing effect during evaporation deposition of the OLED material 112 and the cathode 114 with the evaporation angle set by the evaporation source. In one embodiment, the OLED material 112 and the cathode 114 contact the sidewall 111 of the body structure 110A of the overhang structures 110. In another embodiment, as shown in FIG. 1A, the cathode 114 contacts the sidewall 111 of the body structure 110A of the overhang structures 110. In one embodiment, as shown in FIG. 1A, the encapsulation layer 116 is disposed over the sidewall 111 of the body structure 110A and a bottom surface 107 of the top structure 110B. In another embodiment, shown in FIG. 2B, the body structure 110A is disposed over an assistant cathode 202. The assistant cathode 202 is disposed over a portion of the upper surface 103 of the PDL structure 126. The cathode 114 contacts at least the assistant cathode 202. In another embodiment, the cathode 114 contacts busbars (not shown) outside of an active area of the sub-pixel circuit 100. The cathode 114 and the assistant cathode 202 include a conductive material, such as a metal or metal alloy. E.g., the cathode 114 and/or the assistant cathode 202 include, but are not limited to, chromium, titanium, aluminum, ITO, or a combination thereof. In some embodiments, the material of the cathode 114 is different from the material of the body structure 110A and the top structure 110B.

Each sub-pixel 106 includes include an encapsulation layer 116, e.g., the first sub-pixel 108a has a first encapsulation layer 116A, the second sub-pixel 108b has a second encapsulation layer 116B, and the third sub-pixel 108c has a third encapsulation layer 116C. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of the overhang structures 110 and over at least a portion of a sidewall of each of the adjacent overhang structures 110. In one embodiment, as shown in sub-pixels 108b and 108c of FIG. 1A, the second encapsulation layer 116B and third encapsulation layer 116C are disposed over the cathode 114 and extends under the adjacent overhangs 109 to contact a second portion (not shown) the sidewall 111 of the body structure 110A. In another embodiment, as shown in sub-pixel 108a of FIG. 1A, the first encapsulation layer 116A is disposed over the sidewall 111 of the body structure 110A and a bottom surface 107 of the top structure 110B. In another embodiment, as shown in sub-pixel 108a of FIG. 1B, the first encapsulation layer 116A is disposed over the sidewall 111 of the body structure 110A, the bottom surface 107 of the top structure 110B, a sidewall 113 of the top structure 110B, and a portion of a top surface 115 of the top structure 110B of the overhang structures 110. The encapsulation layer 116 further includes a top surface 119 that defines the uppermost edge of the encapsulation layer 116 between the sidewalls 111 of the body structure 110A.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 100 further includes at least a global passivation layer 120 disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer 120.

The arrangement 101A and the arrangement 101B of the sub-pixel circuit 100 further include at least a global passivation layer 120 disposed over the overhang structures 110 and the encapsulation layers 116. In one embodiment, an intermediate layer 118 may be disposed between the global passivation layer 120 and the overhang structures 110 and the encapsulation layers 116. The intermediate layer 118 may include an inkjet material, such as an acrylic material.

FIG. 1C is a schematic, top sectional view of a sub-pixel circuit 100 having a dot-type architecture 101C. FIG. 1D is a schematic, cross-sectional view of a sub-pixel circuit 100 having a line-type architecture 101D. Each of the top sectional views of FIGS. 1C and 1D are taken along section line 1'-1' of FIGS. 1A and 1B. The dot-type architecture 101C includes a plurality of pixel openings 124A from adjacent PDL structures 126. Each of pixel opening 124A is surrounded by overhang structures 110, as shown in FIG. 1A, that defines each of the sub-pixels 106 of the dot-type architecture 101C. The line-type architecture 101D includes a plurality of pixel openings 124B from adjacent PDL structures 126. Each of pixel opening 124B is abutted by overhang structures 110, as shown in FIG. 1A, that define each of the sub-pixels 106 of the line-type architecture 101D.

FIG. 2A is a schematic, cross-sectional view of an overhang structure 110 of a sub-pixel circuit 100. FIG. 2B is a schematic, cross-sectional view of an overhang structure 110 of a sub-pixel circuit 100. In one embodiment, the overhang structures 110 include a top structure 110B of a non-conductive inorganic material and a body structure 110A of a conductive inorganic material. In another embodiment, the overhang structures 110 including the top structure 110B of a conductive inorganic material and the body structure 110A of a conductive inorganic material. In one embodiment, the cathode 114 contacts the body structure 110A of the overhang structures 110. In another embodiment, as shown in FIG. 2B, the body structure 110A is disposed over an assistant cathode 202. The cathode 114 contacts at least the assistant cathode 202. In another embodiment, the cathode 114 contacts busbars (not shown) outside of an active area of the sub-pixel circuit 100.

The top structure 110B includes an underside edge 206 and an overhang vector 208. The underside edge 206 extends past the sidewall 111 of the body structure 110A. The overhang vector 208 is defined by the underside edge 206 and the PDL structure 126. The OLED material 112 is disposed over the metal-containing layer 104, over the sidewall 127 of the PDL structure 126, and over a first portion 210 of the upper surface 103 of the PDL structure 126, extending under the overhang 109 to an OLED endpoint 218. The OLED material 112 forms an OLED angle $\theta_{OLED}$ between an OLED vector 212 and the overhang vector 208. The OLED vector 212 is defined by an OLED endpoint 218 extending under the top structure 110B and the underside edge 206 of the top structure 110B. In one embodiment, the OLED material 112 may include one or more of a HIL, a HTL, an EML, and an ETL.

The cathode 114 is disposed over the OLED material 112, over the first portion 210 of the PDL structure 126, and over a second portion 211 of the upper surface 103 of the PDL structures 126 in each sub-pixel 106. In some embodiments, which can be combined with other embodiments described herein, the cathode 114 is disposed on a first portion 220 of the sidewall 111 of the body structure 110A. In other embodiments, as shown in FIG. 2B, which can be combined with other embodiments described herein, the cathode 114 contacts a portion 222 of the assistant cathode 202. In the embodiments with the cathode 114 contacting the portion 222 of the assistant cathode 202, the cathode 114 may also contact the first portion 220 of the sidewall 111 of the body structure 110A. The cathode 114 forms a cathode angle $\theta_{cathode}$ between a cathode vector 224 and the overhang vector 208. The cathode vector 224 is defined by a cathode endpoint 226 extending under the top structure 110B and the underside edge 206 of the top structure 110B.

The encapsulation layer 116 is disposed over the cathode 114 (and OLED material 112) with the encapsulation layer 116 extending at least under the top structure 110B of the overhang structure 110 and over at least a portion of a sidewall of the overhang structure 110. In one embodiment, as shown in sub-pixels 108b and 108c of FIGS. 1A and 1B, the second encapsulation layer 116B and 116C are disposed over the cathode 114 and extends under the adjacent overhangs 109 to contact a second portion (not shown) of the sidewall 111 of the body structure 110A. In another embodiment, as shown in FIG. 2A, the first encapsulation layer 116A is disposed over the sidewall 111 of the body structure 110A and a bottom surface 107 of the top structure 110B. In another embodiment, as shown in FIG. 2B, the first encapsulation layer 116A contacts the sidewall 111 of the body structure 110A, the bottom surface 107 of the top structure 110B, a sidewall 113 of the top structure 110B, and a portion of a top surface 115 of the top structure 110B of the overhang structures 110. The encapsulation layer 116 further includes a top surface 119 that defines the uppermost edge of the encapsulation layer 116 between the sidewalls 111 of the body structure 110A.

The encapsulation layer 116 may be varied using deposition thicknesses. Each encapsulation layer 116 has a thickness. The thickness is the distance from the bottom surface of the encapsulation layer to the top surface of the encapsulation layer 116. The first encapsulation layer 116A has a first thickness $t_1$, the second encapsulation layer 116B has a second thickness $t_2$, and the third encapsulation layer 116C has a third thickness $t_3$. In another embodiment, the second thickness $t_2$ is different from the first thickness $t_1$, and the third thickness $t_3$ that is different from the first thickness $t_1$ and the second thickness $t_2$. In one embodiment, as shown in FIG. 1A, the thickness $t_1$ is greater than the thicknesses $t_2$ and $t_3$, and thickness $t_2$ is greater than thickness $t_3$. In another embodiment, as shown in FIG. 1B, the thickness $t_1$ is lesser than the thicknesses $t_2$ and $t_3$, and thickness $t_2$ is lesser than thickness $t_3$. In another embodiment, the thickness $t_2$ is greater than the thicknesses $t_1$ and $t_3$, and thickness $t_1$ is greater than thickness $t_3$. In another embodiment, the thickness $t_2$ is greater than the thicknesses $t_1$ and $t_3$, and thickness $t_3$ is greater than thickness $t_1$.

In another embodiment, the thickness of the encapsulation layer 116 is increased as the wavelength of the light emitted increases, e.g., the first encapsulation layer 116A thickness $t_1$ is thickest at sub-pixel 108a having a red OLED material 112 (~580 nm), the second encapsulation layer 116B thickness $t_2$ is thinner at second sub-pixel 108b having a green OLED material 112 (~540 nm), and the third encapsulation layer 116C thickness $t_3$ is thinnest at sub-pixel 108c having a blue OLED material 112 (~440 nm). In another embodiment, the thickness of the encapsulation layer 116 is decreased as the wavelength of light emitted increases, e.g. the first encapsulation layer 116A thickness $t_1$ is thinnest at sub-pixel 108a having a red OLED material 112 (~580 nm), the second encapsulation layer 116B thickness $t_2$ is thicker at second sub-pixel 108b having a green OLED material 112 (~540 nm), and the third encapsulation layer 116C thickness $t_3$ is thickest at sub-pixel 108c having a blue OLED material 112 (~440 nm). In another embodiment, the thickness of the encapsulation layer 116 may vary independent from the type of OLED light used at the sub-pixels 108a, 108b, and 108c. The encapsulation layer in each sub-pixel are varied in thickness in order to protect deposited layers during etching of subsequent encapsulation layers. The thicknesses $t_1$, $t_2$ and $t_3$ can range between about 0.5 μm and about 2.0 μm, such as about 0.8 μm to about 1.2 μm.

The encapsulation layer 116 includes the non-conductive inorganic material, such as the silicon-containing material. The silicon-containing material may include silicon nitride (e.g., $Si_3N_4$) materials, silicon oxynitride materials (e.g., $Si_2N_2O$), silicon oxide materials (e.g., $SiO_2$), or a combination thereof. In one embodiment, the first encapsulation layer 116A includes silicon nitride materials, the second encapsulation layer 116B includes a silicon oxynitride material, and the third encapsulation layer 116C includes silicon oxide. The thicknesses of the encapsulation layer 116 may depend on the etch selectivity of the material of the encapsulation layer 116. The silicon-containing materials can further be varied to change the optical properties of the encapsulation layer 116. For example, the silicon-containing materials can be tuned to increase or decrease the refractive index. The difference in refractive index can also effect the etching rate of the encapsulation layer 116. This allows for additional etch selectivity control of the encapsulation layer 116. In one embodiment, the first encapsulation layer 116A has a first refractive index, the second encapsulation layer 116B has a second refractive index, and the third encapsulation layer 116C has a third refractive index. In this embodiment, the first refractive index, the second refractive index, and the third refractive index are different from each other.

At least one of the first encapsulation layer 116A, the second encapsulation layer 116B, and the third encapsulation layer 116C may include at least two layers of the silicon-containing material. At least one of the first encapsulation layer 116A, the second encapsulation layer 116B, and the third encapsulation layer 116C includes a composition for at least one of the layers of the silicon-containing material that is different from the compositions of the other encapsulation layers 116. In a first example, the first encapsulation layer 116A includes a silicon oxynitride material over a silicon nitride material. The second encapsulation layer 116B includes a silicon oxide layer over a silicon nitride layer. The third encapsulation layer 116C includes a silicon nitride layer over a silicon oxide layer. In a second example, the first encapsulation layer 116A includes a silicon oxide layer over a silicon oxynitride layer. The second encapsulation layer 116B includes a silicon nitride layer over a silicon oxynitride layer. The third encapsulation layer 116C has a silicon oxynitride layer over a silicon oxide layer. The silicon nitride material has a thickness of about 0.8 μm to about 1.2 µm. The silicon oxynitride layer has a thickness of about 0.2 µm to about 0.4 µm. The silicon oxide layer has a thickness of about 0.2 µm to about 0.4 µm.

The encapsulation layer 116 may further be varied using different modes of deposition, e.g., atomic layer deposition (ALD), chemical vapor deposition (CVD), and physical vapor deposition (PVD). In one example, the first sub-pixel 108a includes silicon nitride is deposited using CVD and silicon oxide deposited using ALD. The second sub-pixel 108b includes silicon nitride deposited using CVD and silicon oxynitride deposited using CVD. The third sub-pixel 108c includes silicon nitride deposited using CVD. The encapsulation layer 116 may further be varied between using an inductively coupled plasma (IDP) or a conductively coupled plasma (CCP) for the deposition processes.

By varying the encapsulation layer 116 compositions, deposition methods, and thicknesses, the encapsulation layer in each sub-pixel protects deposited layers during deposition of subsequent layers and improves process yield and efficiency. The variation in encapsulation layer 116 thicknesses further controls the distance between the underside edge 206 and the top surface of the encapsulation layer 116, as shown in sub-pixels 108b and 108c in FIG. 1 and FIG. 2, and the distance between an encapsulation edge 230 and top surface 119 of the encapsulation layer 116. The distances control the amount of etching and deposition that occurs under the overhang structures 110, leading to increased OLED material 112 protection during subsequent deposition and etching.

The encapsulation layer 116 extends under the overhang structure 110 to contact the second portion of the body structure 110A. A distance is defined between an encapsulation edge 230 and the top surface 119 of the encapsulation layer 116. In one embodiment, the first encapsulation layer 116A is in an entire area of the overhang 109. In this embodiment, the thickness $t_1$ of the encapsulation is from the bottom surface 107 of the top structure 110B to the bottom surface of the first encapsulation layer 116A. E.g., there is no distance between an encapsulation edge 230 and the top surface 119 of the encapsulation layer 116. In another embodiment, as shown at sub-pixel 108a in FIG. 1B and FIG. 2B, the first encapsulation layer 116A extends under the overhang structure 110 to contact the body structure 110A, the bottom surface 107 of the top structure 110B, the sidewall 113 of the top structure 110B, and a portion 117 of the top surface 115 of the top structure 110B. The first encapsulation layer 116A has a thickness $t_1$ to fill a portion of the area under the overhang 109. A gap is defined between the first encapsulation layer 116A on the bottom surface 107 of the top structure 110B and the first encapsulation layer 116A over the cathode 114. The thickness $t_1$ determines the distance D1 of the gap between the encapsulation edge 230 and the top surface 119 of the first encapsulation layer 116A. In another embodiment, as shown at second sub-pixel 108b in FIG. 1A and FIG. 1B, the second encapsulation layer 116B extends under the overhang structure 110 to contact a portion of the body structure 110A. The second encapsulation layer 116B has a second thickness $t_2$ at the second sub-pixel to fill a portion of the area under the overhang 109. A gap is defined between underside edge 206 of the top structure 110B and the second encapsulation layer 116B over the cathode 114. The second thickness $t_2$ determines the distance D2 of the gap between the underside edge 206 and the top surface 119 of the second encapsulation layer 116B. In another embodiment, as shown at sub-pixel 108c in FIG. 1A and FIG. 1B, the third encapsulation layer 116C extends under the overhang structure 110 to contact a portion of the body structure 110A. The third encapsulation layer 116C having a third thickness $t_3$ at the third sub-pixel 108c to fill a portion of the area under the overhang 109. A gap is defined between underside edge 206 of the top structure 110B and the third encapsulation layer 116C over the cathode 114. The third thickness $t_3$ determines the distance D3 of the gap between the underside edge 206 and the top surface 119 of the third encapsulation layer 116C. In yet another embodiment, the first encapsulation layer 116A with a first thickness $t_1$, the second encapsulation layer 116B has a second thickness $t_2$, and the third encapsulation layer 116C has a third thickness $t_3$. The second thickness $t_2$ is different from the first thickness $t_1$. The third thickness $t_3$ being different from the first thickness $t_1$ and the second thickness $t_2$. While FIG. 1A depicts an embodiment with the first encapsulation layer 116A of the first sub-pixel 108a in an entire area of the overhang and FIG. 1B depicts an embodiment with the first encapsulation layer 116A of the first sub-pixel 108a containing a portion of a top surface 115 of the top structure 110B, the first encapsulation layer 116A of the first sub-pixel 108a, the second encapsulation layer 116B of the second sub-pixel 108b, and the third encapsulation layer 116C the third sub-pixel 108c may include any combination of the embodiments described herein.

During evaporation deposition of the OLED material 112, the underside edge 206 of the top structure 110B defines the position of the OLED endpoint 218. E.g., the OLED material 112 is evaporated at an OLED maximum angle that corresponds to the OLED vector 212 and the underside edge 206 ensures that the OLED material 112 is not deposited past the OLED endpoint 218. During evaporation deposition of the cathode 114, the underside edge 206 of the top structure 110B defines the position of the cathode endpoint 226. E.g., the cathode 114 is evaporated at a cathode maximum angle that corresponds to the cathode vector 224 and the underside edge 206 ensures that the cathode 114 is not deposited past the cathode endpoint 226. The OLED angle $\theta_{OLED}$ is less than the cathode angle $\theta_{cathode}$.

Figure 3:
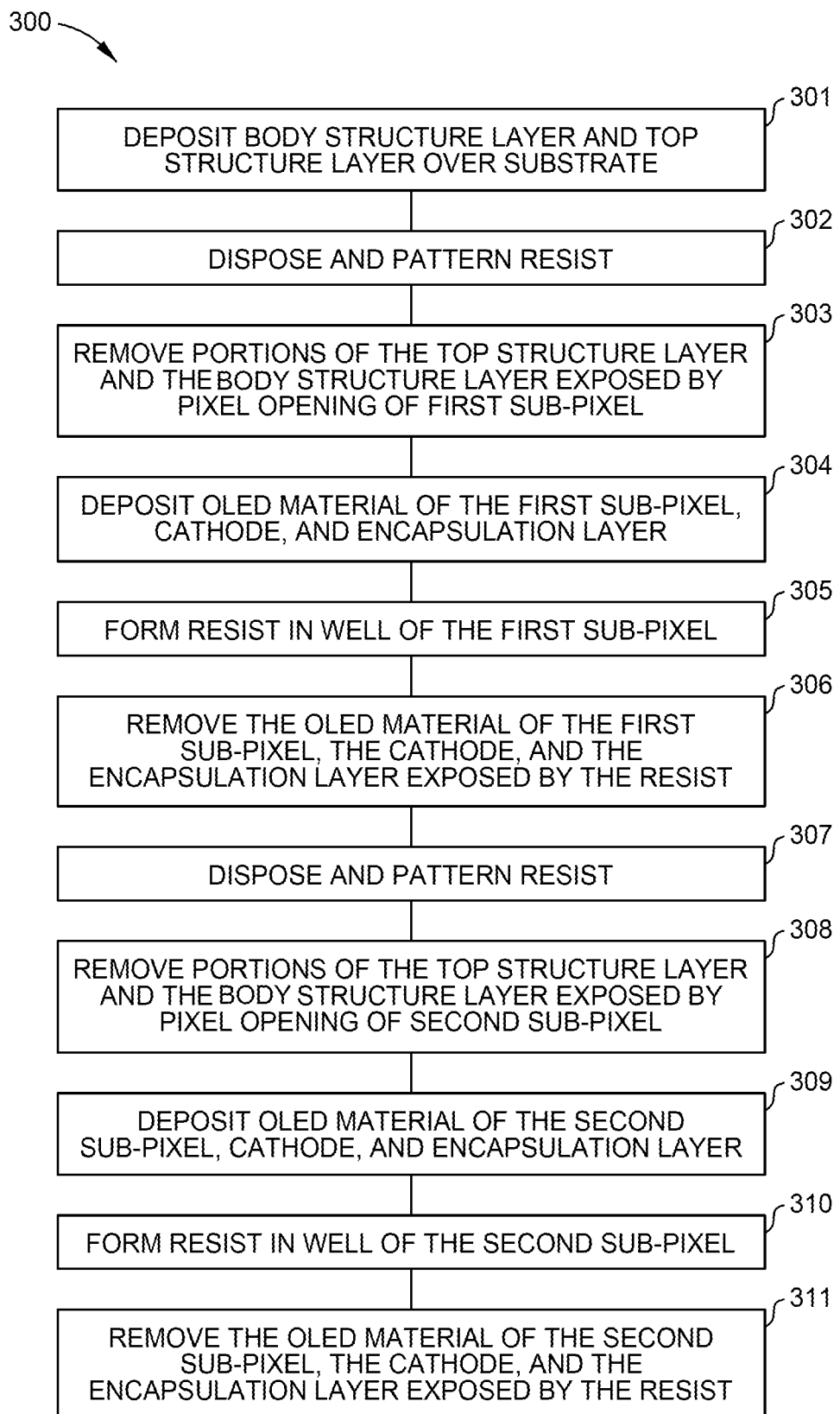
FIG. 3 is a flow a flow diagram of an on-demand method for forming a sub-pixel circuit according to embodiments.

FIG. 3 is a flow diagram of a method 300 for forming a sub-pixel circuit 100, according to embodiments. FIGS. 4A-4K are schematic, cross-sectional views of a substrate 102 during the method 300 for forming the sub-pixel circuit 100, according to embodiments described herein. The method 300 described herein provides for the ability to fabricate both the sub-pixel circuit 100 with the dot-type architecture 101C and the sub-pixel circuit 100 with the line-type architecture 101D.

At operation 301, as shown in FIG. 4A, a body structure layer 402A and top structure layer 402B are deposited over the substrate 102. The body structure layer 402A is disposed over the PDL structures 126 and the metal-containing layers 104. The top structure layer 402B is disposed over the body structure layer 402A. The body structure layer 402A corresponds to the body structure 110A and the top structure layer 402B corresponds to the top structure 110B of the overhang structures 110. In some embodiments of the overhang structures 110, an assistant cathode layer (not shown) is disposed between the body structure layer 402A and the PDL structures 126 and the metal-containing layers 104.

At operation 302, as shown in FIG. 4B, a resist 406 is disposed and patterned. The resist 406 is disposed over the top structure layer 402B. The resist 406 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 406 determines whether the resist is a positive resist or a negative resist. The resist 406 is patterned to form one of a pixel opening 124A of the dot-type architecture 101C or a pixel opening 124B of the line-type architecture 101D of a first sub-pixel 108a. The patterning is one of a photolithography, digital lithography process, or laser ablation process.

At operation 303, as shown in FIG. 4C, portions of the top structure layer 402B and the body structure layer 402A exposed by the pixel opening 124A, 124B are removed. The top structure layer 402B exposed by the pixel opening 124A, 124B may be removed a dry etch process or a wet etch process. The body structure layer 402A exposed by the pixel opening 124A, 124B may be removed by a dry etch process of a wet etch process. In embodiments including the assistant cathode layer, a portion of the assistant cathode layer may be removed by a dry etch process or a wet etch process to form the assistant cathode 202 disposed under the body structure 110A. Operation 303 forms the overhang structures 110 of the first sub-pixel 108a. The etch selectivity of the between the materials of the top structure layer 402B corresponding to the top structure 110B and the body structure layer 402A corresponding to the body structure 110A and the etch processes to remove the exposed portions of the top structure layer 402B and the body structure layer 402A provide for the bottom surface 107 of the top structure 110B being wider than the top surface 105 of the body structure 110A to form the top extension 109A that defines the overhang 109 (as shown in FIGS. 1A, 1B, 2A, and 2B). The shadowing of the overhang 109 provides for evaporation deposition the OLED material 112 and the cathode 114.

Figure 4D:
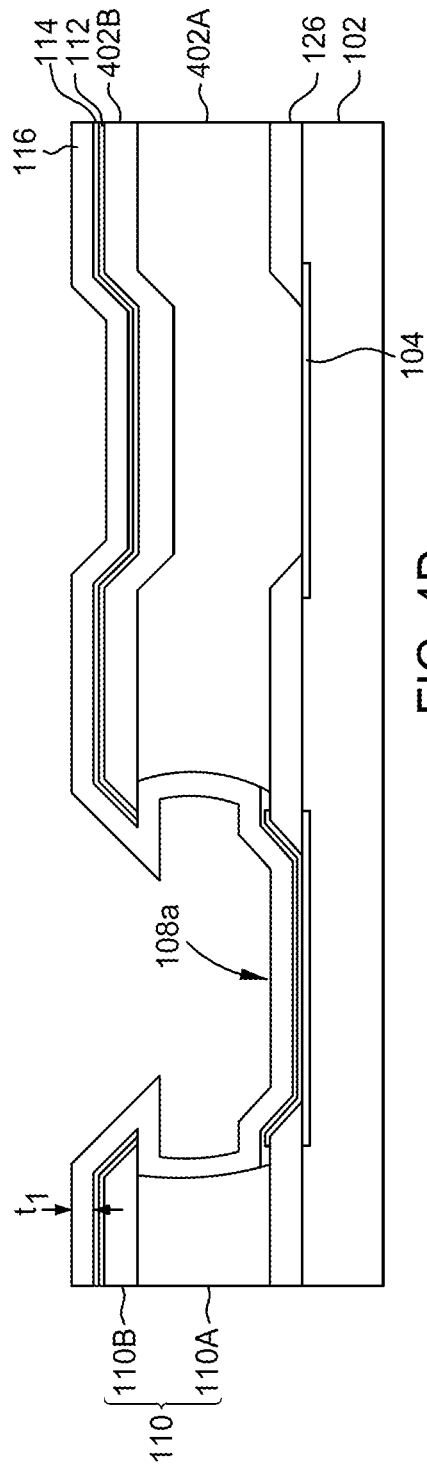

At operation 304, as shown in FIG. 4D, the OLED material 112 of the first sub-pixel 108a, the cathode 114, and the encapsulation layer 116 are deposited. The shadowing of the overhang 109 provides for evaporation deposition each of the OLED material 112 and a cathode 114. As further discussed in the corresponding description of FIG. 2, the shadowing effect of the overhang structures 110 define the OLED angle $\theta_{OLED}$ (shown in FIGS. 1A and 2A) of the OLED material 112 and the cathode angle $\theta_{cathode}$ (shown in FIGS. 1A and 2A) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. In another embodiment, the cathode 114 contacts at least the assistant cathode 202. The encapsulation layer 116 is deposited over the cathode 114 with a thickness $t_1$. In embodiments including capping layers, the capping layers are deposited between the cathode 114 and the encapsulation layer 116. The capping layers may be deposited by evaporation deposition.

Figure 4E:
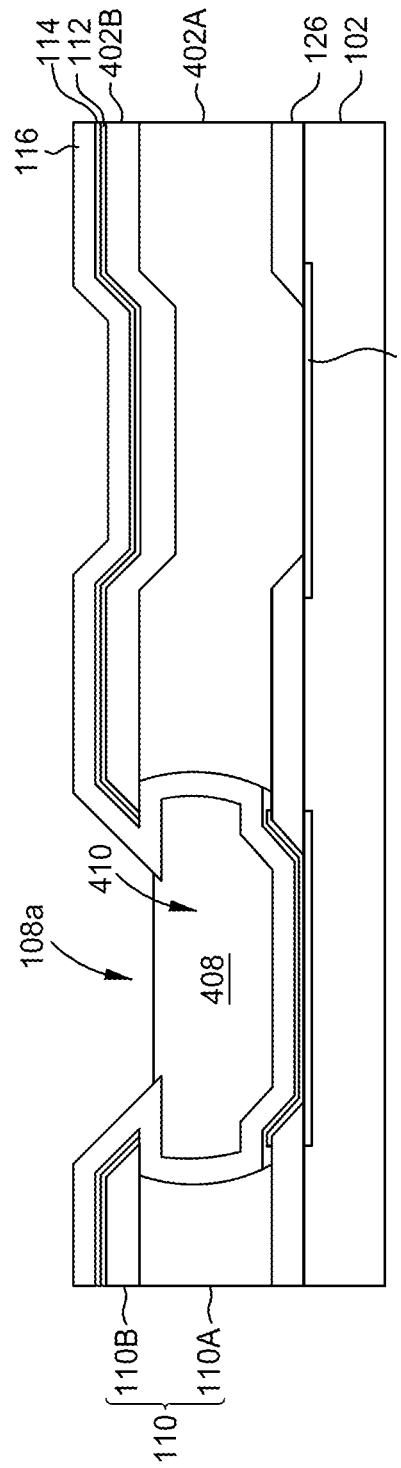

At operation 305, as shown in FIG. 4E, a resist 408 is formed in a well 410 of the first sub-pixel 108a. In one embodiment, a thickness of the resist 408 is different from a thickness of the resist 406. At operation 306, as shown in FIGS. 4F, the encapsulation layer 116, the cathode 114, and the OLED material 112 exposed by the resist 408 are removed. The encapsulation layer 116, the cathode 114, and the OLED material 112 exposed by resist 408 may be removed by wet etch processes. The resist 408 is removed from the well, leaving behind the overhang structures 110. At operation 307, as shown in FIGS. 4G, a resist 412 is disposed and patterned. In one embodiment, a thickness of the resist 412 is different from the thickness of the resist 406 and the resist 408. The resist 412 is disposed over the top structure layer 402B and the top structure 1106 of the first sub-pixel 108a. The resist 412 is patterned to form one of the pixel opening 124A of the dot-type architecture 101C or the pixel opening 124B of the line-type architecture 101D of a second sub-pixel 108b.

At operation 308, as shown in FIG. 4H, portions of the top structure layer 402B and the body structure layer 402A exposed by the pixel opening 124A, 1246 of the second sub-pixel 108b are removed. The top structure layer 402B exposed by the pixel opening 124A, 124B may be removed a dry etch process or wet etch process. The body structure layer 402A exposed by the pixel opening 124A, 124B may be removed by a dry etch process or a wet etch process. In embodiments including the assistant cathode layer, a portion of the assistant cathode layer may be removed by a dry etch process or a wet etch process to form the assistant cathode 202 disposed under the body structure 110A. Operation 308 forms the overhang structures 110 of the second sub-pixel 108b. The etch selectivity of the materials of the top structure layer 402B corresponding to the top structure 1106 and the body structure layer 402A corresponding to the body structure 110A and the etch processes to remove the exposed portions of the top structure layer 402B and the body structure layer 402A provide for the bottom surface 107 of the top structure 1106 being wider than the top surface 105 of the body structure 110A to form the top extension 109A that defines the overhang 109 (as shown in FIG. 1A). The shadowing of the overhang 109 provides for evaporation deposition the OLED material 112 and the cathode 114.

At operation 309, as shown in FIGS. 4I, the OLED material 112 of the second sub-pixel 108b, the cathode 114, and the encapsulation layer 116 are deposited. In embodiments including capping layers, the capping layers are deposited between the cathode 114 and the encapsulation layer 116. The capping layers may be deposited by evaporation deposition. The shadowing of the overhang 109 provides for evaporation deposition of the OLED material 112 and a cathode 114. The shadowing effect of the overhang structures 110 define the OLED angle $\theta_{OLED}$ of the OLED material 112 and the cathode angle $\theta_{cathode}$ of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. In another embodiment, the cathode 114 contacts at least the assistant cathode 202. The encapsulation layer 116 is deposited over the cathode 114 with a thickness $t_2$. In one embodiment, the thickness $t_2$ is lesser than the thickness $t_1$. In another embodiment, the thickness $t_2$ is greater than the thickness $t_1$.

Figure 4J:
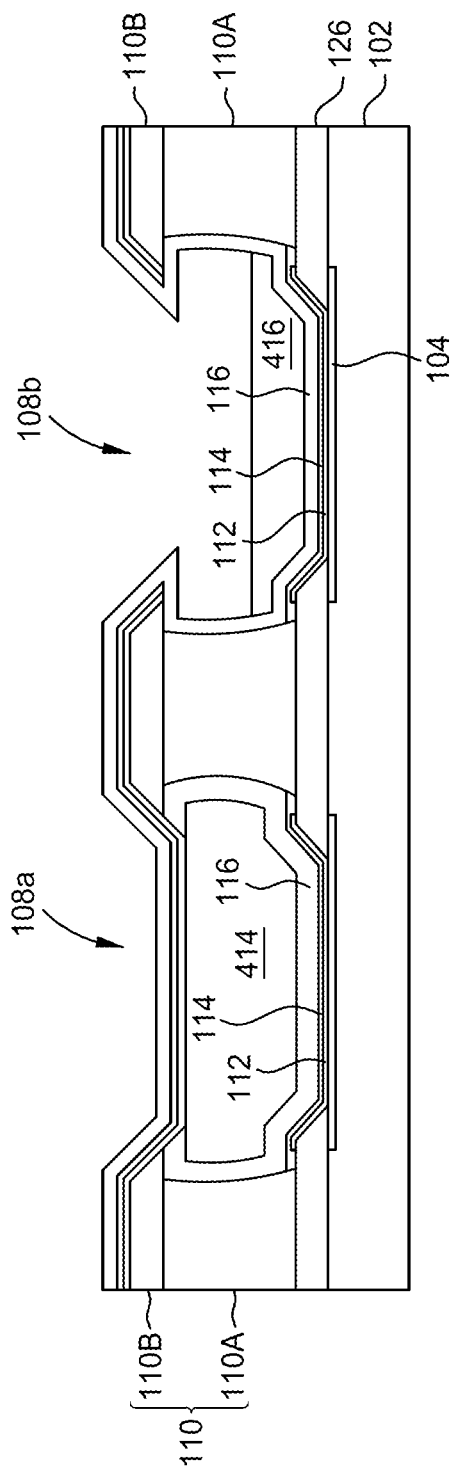
Figure 4K:
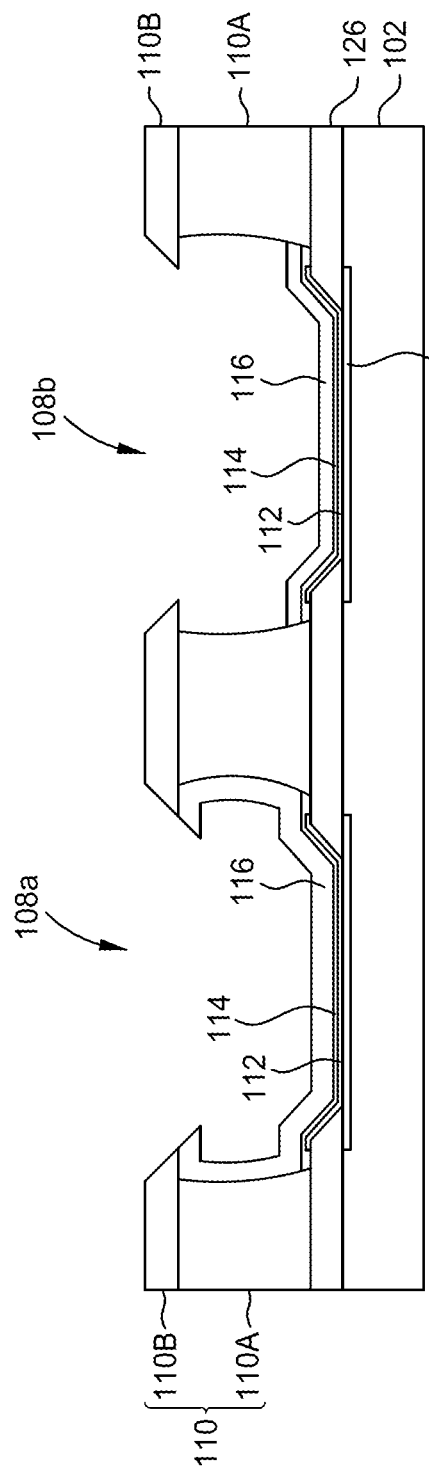

At operation 310, as shown in FIG. 4J, a resist 416 is formed in a well of the second sub-pixel 108b. In one embodiment, a thickness of the resist 416 is different from a thickness of the resist 406, the resist 408, and the resist 412. At operation 311, as shown in FIG. 4K, the encapsulation layer 116, the cathode 114, and the OLED material 112 exposed by the resist 416 are removed. The encapsulation layer 116, the cathode 114, and the OLED material 112 exposed by resist 416 may be removed by wet etch processes. The resist 416 is removed from the well, leaving behind the overhang structures 110. Operations 301-311 described herein form the sub-pixel circuit 100 including two sub-pixels 106. Operations 306-310 may be repeated for each addition sub-pixel, e.g. for a third and/or a fourth sub-pixel. The encapsulation layer 116 for a third sub-pixel 108c, as shown in FIGS. 1A and 1B, has a thickness $t_3$. Any additional pixels 108n have an encapsulation layer 116 with a thickness $t_n$. In one embodiment, the thickness $t_3$ of the encapsulation layer 116 in sub-pixel 108c is lesser than the thicknesses $t_1$ and $t_2$. In another embodiment, the thickness $t_3$ of the encapsulation layer 116 in sub-pixel 108c is greater than the thicknesses $t_1$ and $t_2$. In another embodiment, the thickness $t_3$ of the encapsulation layer 116 in sub-pixel 108c is lesser than the thickness $t_1$ and greater than the thickness $t_2$. In another embodiment, the thickness $t_3$ of the encapsulation layer 116 in sub-pixel 108c is greater than the thickness $t_1$ and lesser than the thickness $t_2$. In another embodiment, the thickness of the encapsulation layer 116 is increased as the wavelength of light emitted increases. In another embodiment, the thickness of the encapsulation layer 116 is decreased as the wavelength of light emitted increases.

Thicknesses, compositions, and deposition methods of the encapsulation layer 116 may be varied, as described above. By varying the encapsulation layer 116 compositions and deposition methods to create variations in thicknesses, the encapsulation layer 116 protects the deposited OLED material 112 from damage during layering and improves process yield and efficiency. The variation in encapsulation layer 116 thicknesses further controls the distance between the underside edge 206 and the top surface of the encapsulation layer 116, as shown in sub-pixels 108b and 108c in FIG. 1 and FIG. 2, and the distance between an encapsulation edge 230 of the encapsulation layer 116 and top surface 119 of the encapsulation layer 116. The distances control the amount of etching and deposition that occurs under the overhang structures 110, leading to increased OLED material 112 protection during subsequent deposition and etching.

Figure 5:
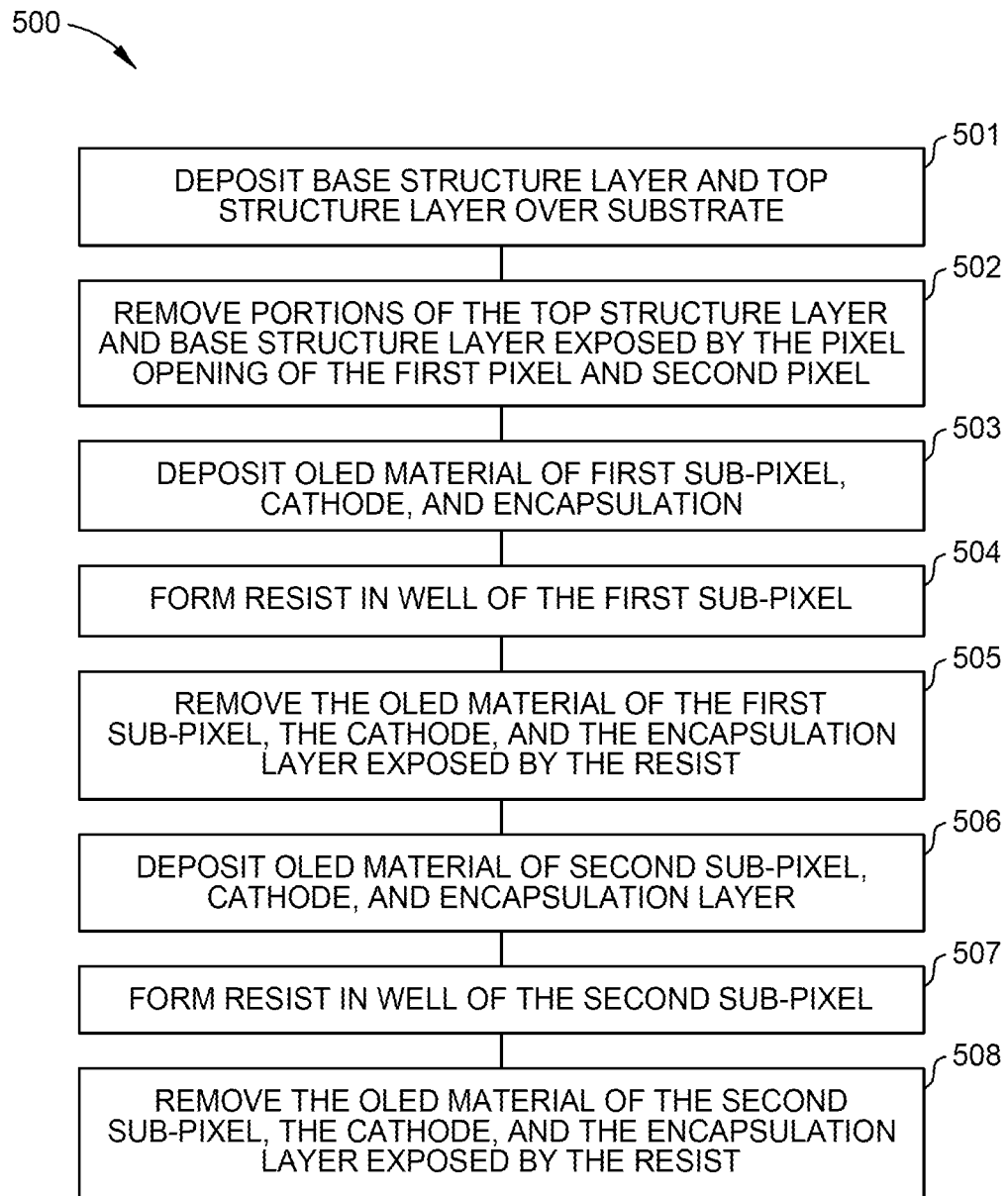
FIG. 5 is a flow a flow diagram of a one-step method for forming a sub-pixel circuit according to embodiments.

FIG. 5 is a flow a flow diagram of a method 500 for forming a sub-pixel circuit 100. FIGS. 6A-6H are schematic, cross-sectional views of a substrate 102 during the method 500 for forming the sub-pixel circuit 100 according embodiments described herein.

Figure 6A:
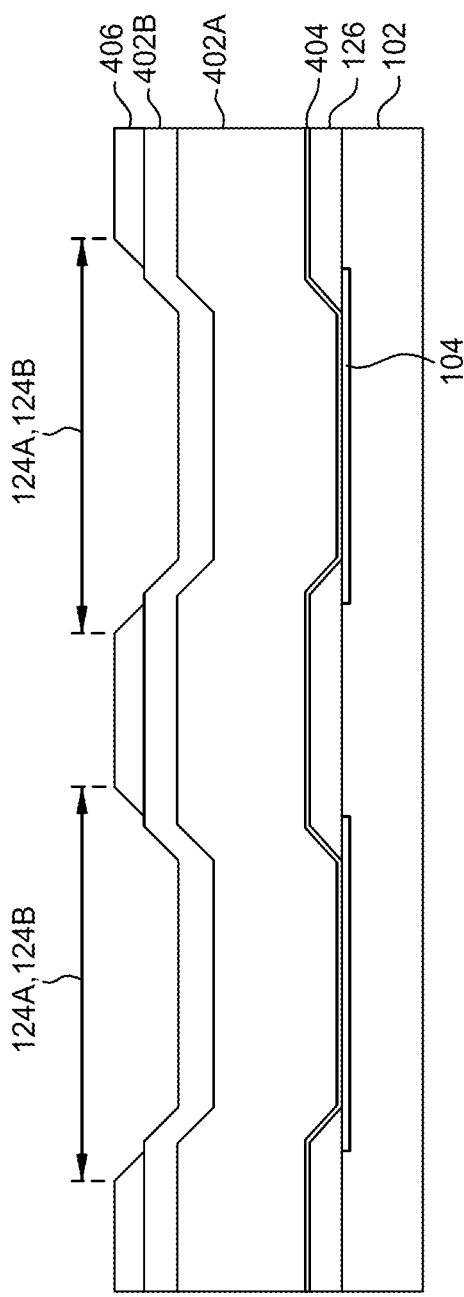
Figure 6B:
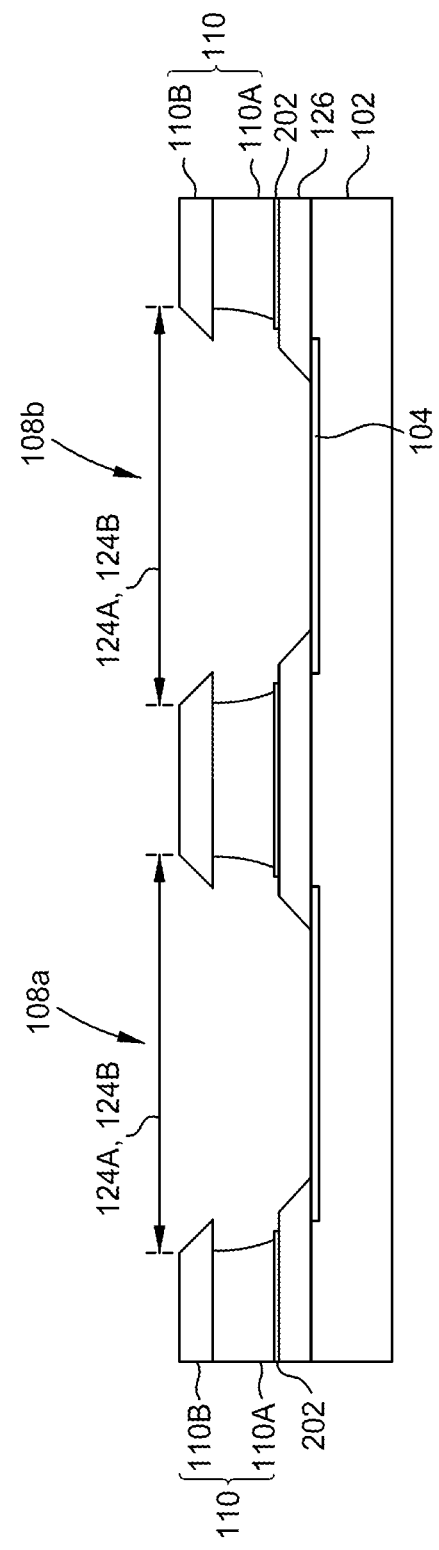

At operation 501, as shown in FIG. 6A, a body structure layer 402A and a top structure layer 402B are deposited over the substrate 102. The body structure layer 402A is disposed over the PDL structures 126 and the metal-containing layers 104. The top structure layer 402B is disposed over the body structure layer 402A. The body structure layer 402A corresponds to the body structure 110A and the top structure layer 402B corresponds to top structure 110B of the overhang structures 110. In some embodiments, of the overhang structures 110, an assistant cathode layer 404 is disposed between the body structure layer 402A and the PDL structures 126 and the metal-containing layers 104. The assistant cathode layer 404 corresponds to the assistant cathode 202. A resist 406 is disposed and patterning over the top structure layer 402B to expose pixel openings 124A, 124B. At operation 502, as shown in FIG. 6B, the overhang structure portions of the top structure layer 402B and the body structure layer 402A exposed by the pixel opening 124A, 124B are removed. The top structure layer 402B exposed by the pixel opening 124A, 124B may be removed a dry etch process or a wet etch process. The body structure layer 402A exposed by the pixel opening 124A, 124B may be removed by a dry etch process or a wet etch process.

Figure 6C:
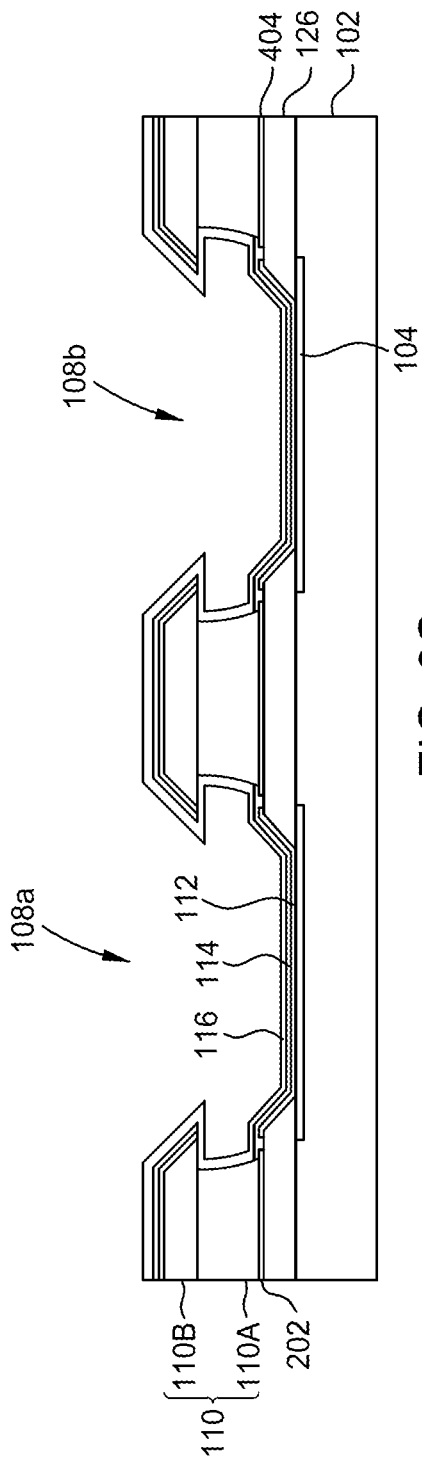

At operation 503, as shown in FIG. 6C, the OLED material 112 of the first sub-pixel 108a, the cathode 114, and the encapsulation layer 116 are deposited. In embodiments including capping layers, the capping layers are deposited between the cathode 114 and the encapsulation layer 116. The capping layers may be deposited by evaporation deposition. As further discussed in the corresponding description of FIG. 2B, the shadowing effect of the overhang structures 110 define the OLED angle $\theta_{OLED}$ (shown in FIG. 2B) of the OLED material 112 and the cathode angle $\theta_{cathode}$ (shown in FIG. 2B) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. In another embodiment, the cathode 114 contacts at least the assistant cathode 202. The encapsulation layer 116 is deposited over the cathode 114 with a thickness $t_1$.

Figure 6D:
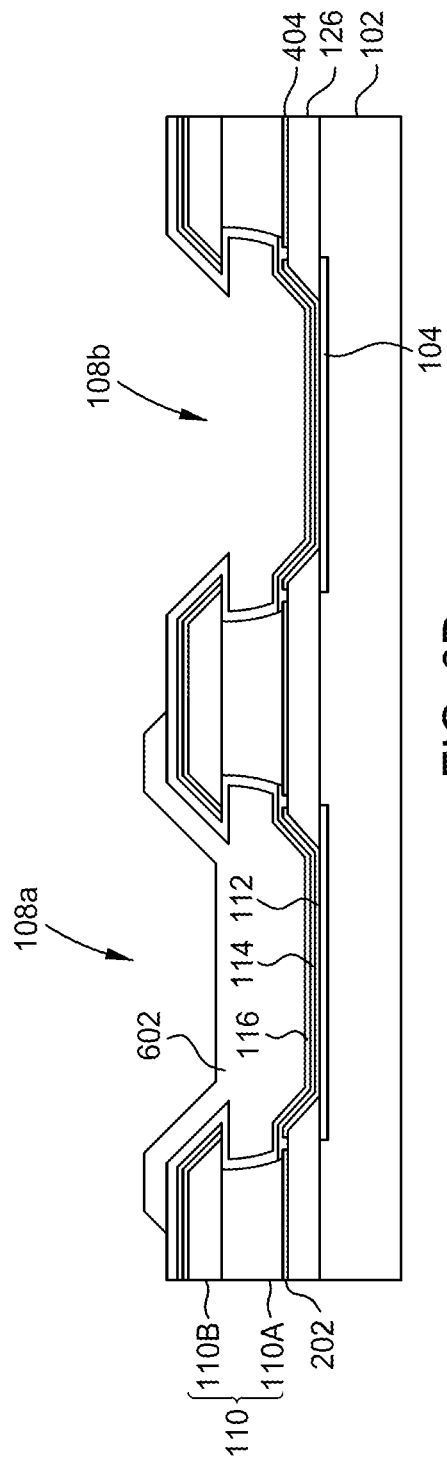

At operation 504, as shown in FIG. 6D, a resist 602 is formed in a well of the first sub-pixel 108a. In one embodiment, the resist 602 has a thickness that is different from a thickness of the resist 406. At operation 505, as shown in FIGS. 6E, the encapsulation layer 116, the cathode 114, and the OLED material 112 exposed by the resist 602 are removed. The encapsulation layer 116, the cathode 114, and the OLED material 112 exposed by resist 602 may be removed by wet etch processes. The resist 602 is removed.

At operation 506, as shown in FIG. 6F, the OLED material 112 of the second sub-pixel 108b, the cathode 114, and the encapsulation layer 116 are deposited. A resist 604 is formed in a well of the first sub-pixel 108a and the OLED material 112, the cathode 114 and the encapsulation layer 116 are deposited over the resist 604. In one embodiment, the resist 604 has a thickness that is different from the thickness of the resist 602 and the resist 406. In embodiments including capping layers, the capping layers are deposited between the cathode 114 and the encapsulation layer 116. The capping layers may be deposited by evaporation deposition. The shadowing of the overhang 109 provides for evaporation deposition each of the OLED material 112 and a cathode 114. The shadowing effect of the overhang structures 110 define the OLED angle $\theta_{OLED}$ of the OLED material 112 and the cathode angle $\theta_{cathode}$ of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. In the cathode 114 contacts at least the assistant cathode 202. The encapsulation layer 116 is deposited over the cathode 114 with a thickness $t_2$. In one embodiment, the thickness $t_2$ is lesser than the thickness $t_1$. In another embodiment, the thickness $t_2$ is greater than the thickness $t_1$.

Figure 6G:
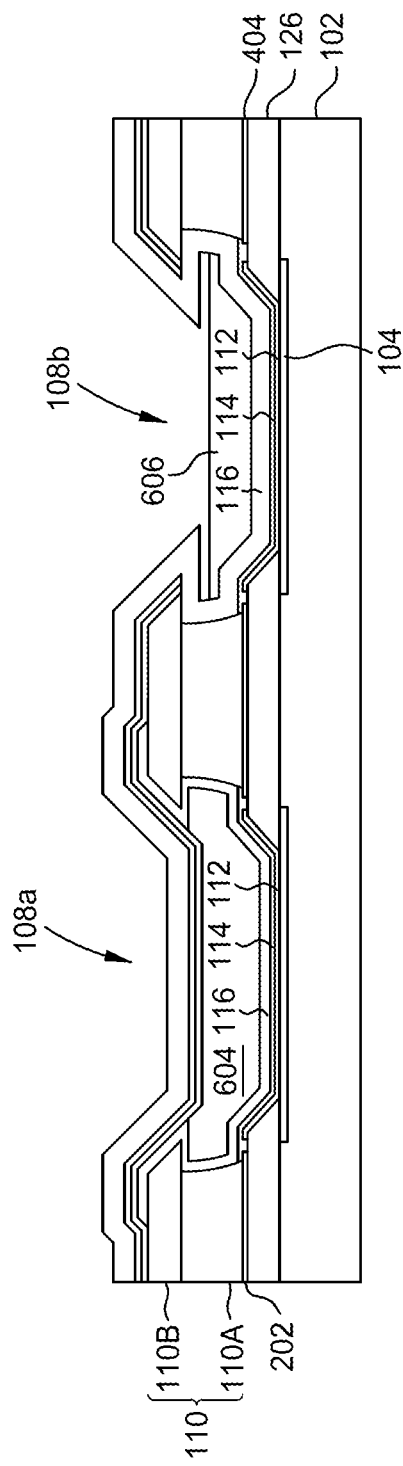
Figure 6H:
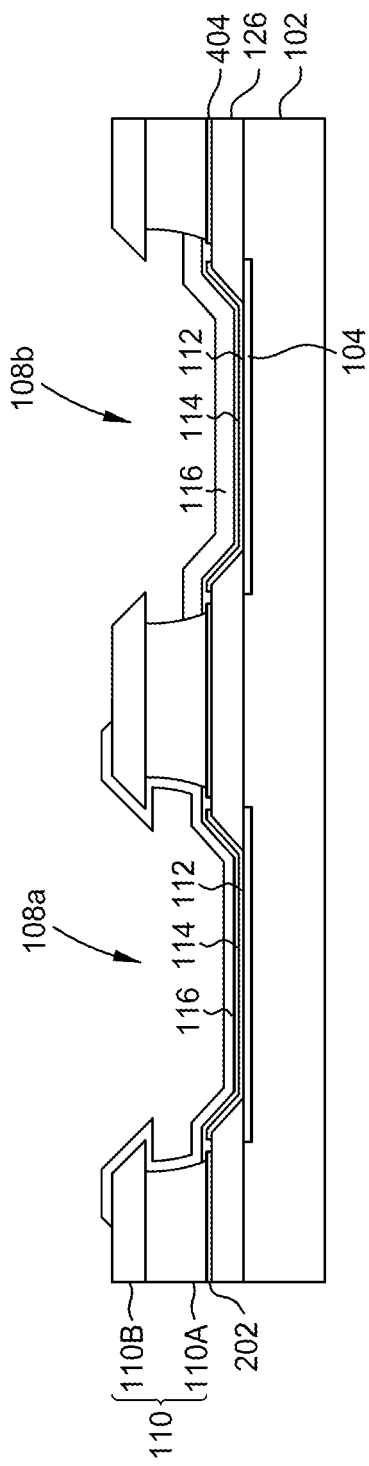

At operation 507, as shown in FIG. 6G, a resist 606 is formed in a well of the second sub-pixel 108b. In one embodiment, the resist 606 has a thickness that is different from the thickness of the resist 406, the resist 602, and the resist 604. At operation 508, as shown in FIG. 6H, the encapsulation layer 116, the cathode 114, and the OLED material 112 exposed by the resist 416 are removed. The encapsulation layer 116, the cathode 114, and the OLED material 112 exposed by resist 606 may be removed by wet etch processes. The resist 606 is removed.

Operations 501-508 described herein form the sub-pixel circuit 100 including two or more sub-pixels 106. Operations 505-508 may be repeated for each addition sub-pixel, e.g. for a third and/or a fourth sub-pixel. The encapsulation layer 116 for a third sub-pixel 108c, as shown in FIGS. 1A and 1B, has a thickness $t_3$. Any additional pixels 108n have an encapsulation layer 116 with a thickness $t_n$. In one embodiment, the thickness $t_3$ of the encapsulation layer 116 in sub-pixel 108*c* is lesser than the thicknesses $t_1$ and $t_2$. In another embodiment, the thickness $t_3$ of the encapsulation layer 116 in sub-pixel 108*c* is greater than the thicknesses $t_1$ and $t_2$. In another embodiment, the thickness $t_3$ of the encapsulation layer 116 in sub-pixel 108*c* is lesser than the thickness $t_1$ and greater than the thickness $t_2$. In another embodiment, the thickness $t_3$ of the encapsulation layer 116 in sub-pixel 108*c* is greater than the thickness $t_1$ and lesser than the thickness $t_2$. In another embodiment, the thickness of the encapsulation layer 116 is increased as the wavelength of light emitted increases. In another embodiment, the thickness of the encapsulation layer 116 is decreased as the wavelength of light emitted increases.

Thicknesses, compositions, and deposition methods of the encapsulation layer 116 may be varied, as described above. By varying the encapsulation layer 116 compositions and deposition methods to create variations in thicknesses, the encapsulation layer 116 protects the deposited OLED material 112 from damage during layering and improves process yield and efficiency. The variation in encapsulation layer 116 thicknesses further controls the distance between the underside edge 206 and the top surface of the encapsulation layer 116, as shown in sub-pixels 108*b* and 108*c* in FIG. 1 and FIG. 2, and the distance between an encapsulation edge 230 of the encapsulation layer 116 and top surface 119 of the encapsulation layer 116. The distances control the amount of etching and deposition that occurs under the overhang structures 110, leading to increased OLED material 112 protection during subsequent deposition and etching.

In summation, described herein are device relate to sub-pixel circuits and methods of forming sub-pixel circuits that may be utilized in a display such as an organic light-emitting diode (OLED) display. The adjacent overhang structures defining each sub-pixel of the sub-pixel circuit of the display provide for formation of the sub-pixel circuit using evaporation deposition and provide for the overhang structures to remain in place after the sub-pixel circuit is formed (e.g., utilizing the methods of the fifth, sixth, or seventh exemplary embodiments). Evaporation deposition may be utilized for deposition of an OLED material and cathode. The overhang structures define deposition angles, i.e., provide for a shadowing effect during evaporation deposition, for each of the OLED material and the cathode such the OLED material does not contact the body structure (and assistant cathode according to embodiments) and the cathode contacts the body structure according to some embodiments. The encapsulation layer of a respective sub-pixel is disposed over the cathode with the encapsulation layer extending under at least a portion of each of the adjacent overhang structures and over a sidewall of each of the adjacent overhang structures. The encapsulation layer in each sub-pixel are varied in thickness in order to protect deposited layers during etching of encapsulation subsequent layers. The variation in thickness can be descending, ascending, or dependent on the OLED material deposited (e.g., the color of the OLED).

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
    a substrate;
    pixel-defining layer (PDL) structures disposed over the substrate and defining sub-pixels of the device; and
    a plurality of overhang structures, each overhang structure defined by a top extension of a top structure extending laterally past a body structure, each body structure disposed over an upper surface of each PDL structure, adjacent overhang structures of the plurality of overhang structures defining a plurality of sub-pixels including a first sub-pixel and a second sub-pixel;
    the first sub-pixel comprising:
        a first anode;
        a first organic light-emitting diode (OLED) material disposed over and in contact with the first anode and under the adjacent overhang structures;
        a first cathode disposed over the first OLED material and under the adjacent overhang structures; and
        a first encapsulation layer disposed over the first cathode, extending under the adjacent overhang structures and contacting a portion of a sidewall of the adjacent overhang structures, the first encapsulation layer having a first thickness; and
    the second sub-pixel comprising:
        a second anode;
        a second organic light-emitting diode (OLED) material disposed over and in contact with the second anode and under the adjacent overhang structures;
        a second cathode disposed over the second OLED material and under the adjacent overhang structures; and
        a second encapsulation layer disposed over the second cathode, extending under the adjacent overhang structures and contacting a portion of a sidewall of the adjacent overhang structures, the second encapsulation layer having a second thickness different than the first thickness.

2. The device of claim 1, wherein the second encapsulation layer of the second sub-pixel extends under the adjacent overhang structures and contacts a portion of a sidewall of the body structure and a bottom surface of the top structure.

3. The device of claim 1, further comprising a third sub-pixel comprising:
    a third anode;
    a third organic light-emitting diode (OLED) material disposed over and in contact with the third anode and under the adjacent overhang structures;
    a third cathode disposed over the third OLED material and under the adjacent overhang structures; and
    a third encapsulation layer disposed over the third cathode, extending under the adjacent overhang structures and contacting a portion of a sidewall of the overhang structures, the third encapsulation layer having a third thickness different than the first thickness and the second thickness.

4. The device of claim 3, wherein the third encapsulation layer of the third pixel extends under the adjacent overhang structures and contacts a portion of a sidewall of the body structure, a bottom surface of the top structure, a sidewall of the top structure, and a top surface of the top structure.

5. The device of claim 3, wherein the first encapsulation layer, the second encapsulation layer, and the third encapsulation layer comprise a silicon nitride material, silicon oxynitride material, silicon oxide material, or a combination thereof.

6. The device of claim 3, wherein the first encapsulation layer comprises a material different than at least one of the second encapsulation layer or the third encapsulation layer.

7. The device of claim 1, wherein the body structure comprises an inorganic material or a metal-containing material.

8. The device of claim 3, wherein the first encapsulation layer, the second encapsulation layer, and the third encapsulation layer include at least two layers of a silicon-containing material, the at least two layers of the silicon-containing material of at least one the first encapsulation layer, the second encapsulation layer, and the third encapsulation layer is different than each other.

9. The device of claim 1, wherein the first OLED material is disposed over and in contact with the first anode and is disposed under the overhang structures such that the first OLED material contacts the PDL structure and second OLED material is disposed over and in contact with the second anode and is disposed under the overhang structures such that the second OLED material contacts the PDL structure.

10. A device, comprising:
a substrate;
pixel-defining layer (PDL) structures disposed over the substrate and defining sub-pixels of the device; and
a plurality of overhang structures, each overhang structure defined by a top extension of a top structure extending laterally past a body structure to form an overhang, each body structure disposed over an upper surface of each PDL structure, adjacent overhang structures of the plurality overhang structures defining a plurality of sub-pixels including a first sub-pixel and a second sub-pixel;
the first sub-pixel comprising:
a first anode;
a first organic light-emitting diode (OLED) material disposed over and in contact with the first anode and under the adjacent overhang structures;
a first cathode disposed over the first OLED material and under the adjacent overhang structures; and
a first encapsulation layer disposed over the first cathode, extending under the adjacent overhang structures and contacting a portion of a sidewall of the overhang structures, wherein the first encapsulation layer is in an entire area of the overhang, the first encapsulation layer having a first thickness; and
the second sub-pixel comprising:
a second anode;
a second organic light-emitting diode (OLED) material disposed over and in contact with the second anode and under the adjacent overhang structures;
a second cathode disposed over the second OLED material and under the adjacent overhang structures; and
a second encapsulation layer disposed over the second cathode, extending under the adjacent overhang structures and contacting a portion of a sidewall of the adjacent overhang structures, the second encapsulation layer having a second thickness that is different than the first thickness.

11. The device of claim 10, wherein in the overhang:
a gap is between a second encapsulation layer on a bottom surface of the top structure and the second encapsulation layer over the second cathode in the overhang; or
the gap is between an underside edge of the top structure and the second encapsulation layer over the second cathode in the overhang.

12. The device of claim 11, further comprising a third sub-pixel comprising:
a third anode;
a third organic light-emitting diode (OLED) material disposed over and in contact with the third anode and under the adjacent overhang structures;
a third cathode disposed over the third OLED material and under the adjacent overhang structures and contacting a portion of the overhang structures; and
a third encapsulation layer disposed over the third cathode, extending under the adjacent overhang structures and contacting a portion of a sidewall of the overhang structures, the third encapsulation layer having a third thickness that is different than the first thickness and the second thickness.

13. The device of claim 12, wherein the first encapsulation layer, the second encapsulation layer, and the third encapsulation layer comprise a silicon nitride material, silicon oxynitride material, silicon oxide material, or a combination thereof.

14. The device of claim 10, wherein the body structure comprises an inorganic material or a metal-containing material.

15. The device of claim 10, wherein the top structure comprises a non-conductive material, an inorganic material, or a metal-containing material.

16. The device of claim 10, wherein the first cathode extends to contact the PDL structure past an endpoint of the first OLED material and the second cathode extends to contact the PDL structure past an endpoint of the second OLED material.

17. The device of claim 10, wherein the first OLED material is disposed over and in contact with the first anode and is disposed under the overhang structures such that the first OLED material contacts the PDL structure and the second OLED material is disposed over and in contact with the second anode and is disposed under the overhang structures such that the second OLED material contacts the PDL structure.

18. A device, comprising:
a substrate;
pixel-defining layer (PDL) structures disposed over the substrate and defining sub-pixels of the device; and
a plurality of overhang structures, each overhang structure defined by a top extension of a top structure extending laterally past a body structure to form an overhang, each body structure disposed over an upper surface of each PDL structure, adjacent overhang structures of the plurality overhang structures defining a plurality of sub-pixels including a first sub-pixel, a second sub-pixel, and a third sub-pixel;
the first sub-pixel comprising:
a first anode;
a first organic light-emitting diode (OLED) material disposed over and in contact with the first anode and under the adjacent overhang structures;
a first cathode disposed over the first OLED material, the first cathode extending under the adjacent overhang structures and contacting a portion of the overhang structures; and
a first encapsulation layer disposed over the first cathode, extending under the adjacent overhang structures and contacting a portion of a sidewall of the overhang structures, the encapsulation layer having a first thickness; and
the second sub-pixel comprising:
a second anode;
a second organic light-emitting diode (OLED) material disposed over and in contact with the second anode and under the adjacent overhang structures;
a second cathode disposed over the second OLED material, the second cathode extending under the adjacent overhang structures and contacting a portion of the overhang structures; and a second encapsulation layer disposed over the second cathode, extending under the adjacent overhang structures and contacting a portion of a sidewall of the overhang structures, the second encapsulation layer having a second thickness that is different than the first thickness; and the third sub-pixel comprising:
a third anode;
a third organic light-emitting diode (OLED) material disposed over and in contact with the third anode and under the adjacent overhang structures;
a third cathode disposed over the third OLED material, the third cathode extending under the adjacent overhang structures and contacting a portion of a body structure; and
a third encapsulation layer disposed over the third cathode, extending under the adjacent overhang structures and contacting a portion of the sidewall of the overhang structures, the encapsulation layer having a third thickness that is different than the first thickness and the second thickness.

19. The device of claim 18, wherein the first thickness of the first encapsulation layer is greater than the second thickness of the second encapsulation layer and the third thickness of the third encapsulation layer, and wherein the second thickness of the second encapsulation layer is greater than the third thickness of the third encapsulation layer.

20. The device of claim 18, wherein the first thickness of the first encapsulation layer is lesser than the second thickness of the second encapsulation layer and the third thickness of the third encapsulation layer, and wherein the second thickness of the second encapsulation layer is lesser than the third thickness of the third encapsulation layer.

21. The device of claim 18, wherein the first encapsulation layer, the second encapsulation layer, and the third encapsulation layer comprise a silicon nitride material, silicon oxynitride material, silicon oxide material, or a combination thereof.

22. The device of claim 18, wherein the first encapsulation layer has a first refractive index, the second encapsulation layer has a second refractive index different from the first refractive index, and the third encapsulation layer has a third refractive index different from the first refractive index and the second refractive index.

23. The device of claim 18, wherein the body structure comprises an inorganic material or a metal-containing material.

24. The device of claim 18, wherein the first cathode extends to contact the PDL structure past an endpoint of the first OLED material and the second cathode extends to contact the PDL structure past an endpoint of the second OLED material.

25. The device of claim 18, wherein the first OLED material is disposed over and in contact with the first anode and is disposed under the adjacent overhang structure such that the first OLED material contacts the PDL structure and the second OLED material is disposed over and in contact with the second anode and is disposed under the overhang structure such that the second OLED material contacts the PDL structure.

26. A device, comprising:
a substrate;
pixel-defining layer (PDL) structures disposed over the substrate and defining sub-pixels of the device; and
a plurality of overhang structures, each overhang structure defined by a top extension of a top structure extending laterally past a body structure, each body structure disposed over an upper surface of each PDL structure, adjacent overhang structures of the plurality overhang structures defining a plurality of sub-pixels including a first sub-pixel and a second sub-pixel;

the first sub-pixel comprising:
a first anode;
a first organic light-emitting diode (OLED) material disposed over and in contact with the first anode and under the adjacent overhang structures;
a first cathode disposed over the first OLED material and under the adjacent overhang structures; and
a first encapsulation layer disposed over the first cathode, extending under the adjacent overhang structures and contacting a portion of a sidewall of the adjacent overhang structures, the first encapsulation layer comprising at least two layers of a silicon-containing material; and the second sub-pixel comprising:
a second anode;
a second organic light-emitting diode (OLED) material disposed over and in contact with the second anode and under the adjacent overhang structures;
a second cathode disposed over the second OLED material and under the adjacent overhang structures; and
a second encapsulation layer disposed over the second cathode, extending under the adjacent overhang structures and contacting a portion of a sidewall of the adjacent overhang structures, the second encapsulation layer comprising the silicon-containing material with a different composition than the first encapsulation layer.

27. The device of claim 26, further comprising a third sub-pixel comprising:
a third anode;
a third organic light-emitting diode (OLED) material disposed over and in contact with the third anode and under the adjacent overhang structures;
a third cathode disposed over the third OLED material and under the adjacent overhang structures, the third cathode extending to contact a portion of the overhang structures; and
a third encapsulation layer disposed over the third cathode, extending under the adjacent overhang structures and contacting a portion of a sidewall of the overhang structures, the third encapsulation layer having a third thickness that is different than the first thickness and the second thickness.

28. The device of claim 27, wherein the a thickness of the first encapsulation layer is greater than a second thickness of the second encapsulation layer and a third thickness of the third encapsulation layer, and wherein the second thickness of the second encapsulation layer is greater than the third thickness of the third encapsulation layer.

29. The device of claim 28, wherein the first thickness of the first encapsulation layer is lesser than the second thickness of the second encapsulation layer and the third thickness of the third encapsulation layer, and wherein the second thickness of the second encapsulation layer is lesser than the third thickness of the third encapsulation layer.

30. The device of claim 26, wherein the first encapsulation layer is in an entire area of an overhang defined by a top extension of a top structure extending laterally past a body structure.

* * * * *